(12) United States Patent
Guo et al.

(10) Patent No.: US 12,002,234 B2
(45) Date of Patent: Jun. 4, 2024

(54) CRYSTAL LINE GROWING STATE DETECTION METHOD, APPARATUS AND DEVICE FOR SILICON ROD

(71) Applicant: LONGI GREEN ENERGY TECHNOLOGY CO., LTD., Shaanxi (CN)

(72) Inventors: Li Guo, Shaanxi (CN); Qiao Li, Shaanxi (CN); Zhanjun Xu, Shaanxi (CN)

(73) Assignee: LONGI GREEN ENERGY TECHNOLOGY CO., LTD., Shaanxi (CN)

( * ) Notice: Subject to any disclaimer, the term of this patent is extended or adjusted under 35 U.S.C. 154(b) by 403 days.

(21) Appl. No.: 17/256,494

(22) PCT Filed: Nov. 11, 2019

(86) PCT No.: PCT/CN2019/117204
§ 371 (c)(1),
(2) Date: Dec. 28, 2020

(87) PCT Pub. No.: WO2020/108287
PCT Pub. Date: Jun. 4, 2020

(65) Prior Publication Data
US 2021/0279905 A1 Sep. 9, 2021

(30) Foreign Application Priority Data

Nov. 26, 2018 (CN) .......................... 201811417468.5
Aug. 13, 2019 (CN) .......................... 201910745478.X

(51) Int. Cl.
*G06T 7/62* (2017.01)
*C30B 15/26* (2006.01)
(Continued)

(52) U.S. Cl.
CPC ................ *G06T 7/62* (2017.01); *C30B 15/26* (2013.01); *C30B 29/06* (2013.01); *G06T 7/001* (2013.01);
(Continued)

(58) Field of Classification Search
CPC . G06T 2207/20072; G06T 2207/20032; G06T 7/62; G06T 7/001; G06T 7/0004; C30B 29/06; C30B 15/20; C30B 15/26
(Continued)

(56) References Cited

U.S. PATENT DOCUMENTS

| | | | | |
|---|---|---|---|---|
| 5,846,318 A | * | 12/1998 | Javidi ..................... | C30B 15/20 117/14 |
| 6,175,652 B1 | * | 1/2001 | Jacobson ................ | C30B 15/26 382/209 |
| 9,739,728 B1 | * | 8/2017 | Bedell ................... | G01N 23/203 |

FOREIGN PATENT DOCUMENTS

| | | |
|---|---|---|
| CN | 1214116 A | 4/1999 |
| CN | 101226050 A | 7/2008 |

(Continued)

OTHER PUBLICATIONS

China Office Action and Search Report regarding China Application No. 201910745478; dated Jul. 21, 2021; 8 pages.
(Continued)

*Primary Examiner* — Ross Varndell
*Assistant Examiner* — Emmanuel Silva-Avina
(74) *Attorney, Agent, or Firm* — Emerson Thomson Bennett; Daniel A. Thomson

(57) ABSTRACT

A method, apparatus and device for detecting a growth state of a crystalline line of a silicon rod, relating to the technical field of monocrystalline silicon, including in a process of constant-diameter growth of the silicon rod, acquiring a sample image of the silicon rod providing a detection area in
(Continued)

the sample image, wherein the detection area overlaps with a crystalline-line growth line of the silicon rod generating a grayscale-value curve of the detection area, and according to the grayscale-value curve of the detection area, determining the growth state of the crystalline line of the silicon rod on the crystalline-line growth line. The method alleviates the affection on the detection of crystalline lines by the fluctuation of the diameter of the silicon rod and the unclarity of the features of the crystalline lines, thereby improving the accuracy and the efficiency of the detection on the crystalline lines.

6 Claims, 13 Drawing Sheets

(51) Int. Cl.
    *C30B 29/06*     (2006.01)
    *G06T 7/00*     (2017.01)
    *G06T 7/246*     (2017.01)

(52) U.S. Cl.
    CPC .... *G06T 7/246* (2017.01); *G06T 2207/20072* (2013.01); *G06T 2207/30242* (2013.01)

(58) Field of Classification Search
    USPC .......................................................... 382/103
    See application file for complete search history.

(56) References Cited

FOREIGN PATENT DOCUMENTS

| | | |
|---|---|---|
| CN | 101597060 A | 12/2009 |
| CN | 201952525 U | 8/2011 |
| CN | 202170375 U | 3/2012 |
| CN | 102634846 A | 8/2012 |
| CN | 102 787 353 | 11/2012 |
| CN | 102787353 A * | 11/2012 |
| CN | 102787353 A | 11/2012 |
| CN | 104990510 A * | 10/2015 |
| CN | 104990510 A | 10/2015 |
| CN | 105 350 071 | 2/2016 |
| CN | 107436306 A | 12/2017 |
| CN | 107 923 065 | 4/2018 |
| JP | 2001 089 290 | 4/2001 |
| JP | 2003012395 A | 1/2003 |
| KR | 20010034851 A | 4/2001 |
| WO | WO9904066 A1 | 1/1999 |
| WO | 2020 108 287 | 4/2006 |

OTHER PUBLICATIONS

Schmitt, Christian; European Search Report and Search Opinion for Application No. EP19891140; dated Jul. 3, 2022; 10 pages.

* cited by examiner

CRYSTAL LINE GROWING STATE DETECTION METHOD, APPARATUS AND DEVICE FOR SILICON ROD

The present application claims the priorities of the Chinese patent application filed on Aug. 13, 2019 before the Chinese Patent Office with the application number of 201910745478.X and the title of "CRYSTAL LINE GROWING STATE DETECTION METHOD, APPARATUS AND DEVICE FOR SILICON ROD" and the Chinese patent application filed on Nov. 26, 2018 before the Chinese Patent Office with the application number of 201811417468.5 and the title of "METHOD AND DEVICE FOR DETECTING BROKEN LINE AND STORAGE MEDIUM", which are incorporated herein in its entirety by reference.

TECHNICAL FIELD

The present disclosure relates to the technical field of monocrystalline silicon, and particularly relates to a method, apparatus and device for detecting a growth state of a crystalline line of a silicon rod.

BACKGROUND

In the process of the fabrication of monocrystalline silicon by the czochralski method, the surface of the monocrystalline silicon rod has 4 crystalline lines distributed equidistantly in the axial direction, and if dislocation or thermal stress emerges in the monocrystalline silicon rod, that results in that the crystal converts from monocrystalline growth to polycrystalline growth, and the crystalline lines on the surface of the monocrystalline silicon rod are broken. Therefore, whether a crystal rod is monocrystalline silicon or polycrystalline silicon may be determined according to whether the silicon rod has 4 continuous crystalline lines.

The conventional method for automatically detecting the crystalline lines is performed by photographing in real time the silicon rod that is growing, and determining the characteristic pixel value of the crystalline lines. The process particularly comprises: scanning line by line the image obtained by the photographing; when the characteristic pixel value of the crystalline lines is scanned in a certain row, according to the characteristic pixel value of the crystalline lines, calculating the crystalline-line plane height X corresponding to the silicon rod; if the crystalline-line plane height X is equal to 0.5 mm, that indicating that the crystalline lines are not broken, and the silicon rod that is growing at the moment is monocrystalline silicon; and if the crystalline-line plane height X is equal to 0 mm, that indicating that the crystalline lines have a broken line, and the silicon rod that is growing at the moment is polycrystalline silicon.

However, in the conventional solution, in the actual growth process, the diameter of the monocrystalline silicon rod fluctuates, and the feature of the crystalline lines on the surface of the monocrystalline silicon rod is not clear, which results in that the characteristic pixel value of the crystalline lines and the crystalline-line plane height X are difficult to be accurately determined, which results in a low accuracy of the detection on the crystalline lines.

SUMMARY

The present disclosure provides a method, apparatus and device for detecting a growth state of a crystalline line of a silicon rod, which aims at improving the accuracy of the detection on the crystalline lines of silicon rods and reducing the operation complexity.

In a first aspect, an embodiment of the present disclosure provides a method for detecting a growth state of a crystalline line of a silicon rod, wherein the method comprises:
  in a process of constant-diameter growth of the silicon rod, acquiring a sample image of the silicon rod;
  providing a detection area in the sample image, wherein the detection area overlaps with
  a crystalline-line growth line of the silicon rod, and in the process of the constant-diameter growth of the silicon rod, the crystalline line of the silicon rod grows along the crystalline-line growth line;
  generating a grayscale-value curve of the detection area; and
  according to the grayscale-value curve, determining the growth state of the crystalline line of the silicon rod on the crystalline-line growth line.

Optionally, the detection area comprises: a line segment perpendicular to an axial direction of the silicon rod, or a rectangular area perpendicular to an axial direction of the silicon rod, wherein a plane of the rectangular area is perpendicular to the axial direction of the silicon rod.

Optionally, if the detection area is the line segment perpendicular to the axial direction of the silicon rod, the step of generating the gray scale-value curve of the detection area comprises:
  by starting from one end of the line segment, generating a grayscale-value curve corresponding to the line segment.

Optionally, if the detection area is the rectangular area perpendicular to the axial direction of the silicon rod, the step of generating the grayscale-value curve of the detection area comprises: by starting from one end of the rectangular area, dividing the rectangular area into a
  plurality of identical sub-areas;
  calculating an average grayscale value of each of the sub-areas; and
  according to the average grayscale values of all of the sub-areas, generating a grayscale-value curve corresponding to the rectangular area.

Optionally, the step of, according to the grayscale-value curve, determining the growth state of the crystalline line of the silicon rod on the crystalline-line growth line comprises:
  according to the grayscale-value curve, calculating a variance value of the grayscale values in the grayscale-value curve;
  if the variance value of the grayscale values is greater than or equal to a variance-value threshold, determining the growth state to be a continued state; and
  if the variance value of the grayscale values is less than the variance-value threshold, determining the growth state to be a line-breaking state.

Optionally, the step of, according to the grayscale-value curve, determining the growth state of the crystalline line of the silicon rod on the crystalline-line growth line comprises:
  if the grayscale-value curve has a crystalline-line characteristic peak, determining the growth state to be a continued state; and
  if the grayscale-value curve does not have the crystalline-line characteristic peak, determining the growth state to be a line-breaking state.

Optionally, after the step of acquiring the sample image of the silicon rod, the method further comprises:

according to a predetermined image-enhancement algorithm, performing image-enhancement processing to the sample image.

In a second aspect, an embodiment of the present disclosure provides an apparatus for detecting a growth state of a crystalline line of a silicon rod, wherein the apparatus comprises:
  a sample-image acquiring module, configured for, in a process of constant-diameter growth of the silicon rod, acquiring a sample image of the silicon rod;
  a detecting-unit providing module, configured for providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line;
  a grayscale-value-curve generating module, configured for generating a grayscale-value curve of the detection area; and
  a growth-state determining module, configured for, according to the grayscale-value curve, determining the growth state of the crystalline line of the silicon rod on the crystalline-line growth line.

Optionally, the detection area comprises: a line segment perpendicular to an axial direction of the silicon rod, or a rectangular area perpendicular to an axial direction of the silicon rod, wherein a plane of the rectangular area is perpendicular to the axial direction of the silicon rod.

Optionally, if the detection area is the line segment perpendicular to the axial direction of the silicon rod, the grayscale-value-curve generating module comprises:
  a first generating submodule, configured for, by starting from one end of the line segment, generating a grayscale-value curve corresponding to the line segment.

Optionally, if the detection area is the rectangular area perpendicular to the axial direction of the silicon rod, the grayscale-value-curve generating module comprises:
  a dividing submodule, configured for, by starting from one end of the rectangular area, dividing the rectangular area into a plurality of identical sub-areas;
  a first calculating submodule, configured for calculating an average grayscale value of each of the sub-areas; and
  a second generating submodule, configured for, according to the average grayscale values of all of the sub-areas, generating a grayscale-value curve corresponding to the rectangular area.

Optionally, the growth-state determining module comprises:
  a second calculating submodule, configured for, according to the grayscale-value curve, calculating a variance value of the grayscale values in the grayscale-value curve;
  a first determining submodule, configured for, if the variance value of the grayscale values is greater than or equal to a variance-value threshold, determining the growth state to be a continued state; and
  a second determining submodule, configured for, if the variance value of the grayscale values is less than the variance-value threshold, determining the growth state to be a line-breaking state.

Optionally, the growth-state determining module may further comprise:

a third determining submodule, configured for, if the grayscale-value curve has a crystalline-line characteristic peak, determining the growth state to be a continued state; and
  a fourth determining submodule, configured for, if the grayscale-value curve does not have the crystalline-line characteristic peak, determining the growth state to be a line-breaking state.

Optionally, the apparatus further comprises:
  an enhancing module, configured for, according to a predetermined image-enhancement algorithm, performing image-enhancement processing to the sample image.

In a third aspect, an embodiment of the present disclosure provides a device for detecting a growth state of a crystalline line of a silicon rod, wherein the device comprises: an interface, a bus, a first memory and a first processor, the interface, the first memory and the first processor are connected via the bus, the first memory is configured to store an executable program, and the first processor is configured to execute the executable program to implement the steps of the method for detecting a growth state of a crystalline line of a silicon rod.

A fourth aspect of the present disclosure provides a computer-readable storage medium,
  wherein the computer-readable storage medium stores an executable program, and the executable program is executed by a first processor to implement the steps of the method for detecting a growth state of a crystalline line of a silicon rod.

The method for detecting a growth state of a crystalline line of a silicon rod according to the embodiment of the present disclosure comprises: in a process of constant-diameter growth of the silicon rod, acquiring a sample image of the silicon rod; providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line; generating a grayscale-value curve of the detection area; and according to the grayscale-value curve, determining the growth state of the crystalline line of the silicon rod on the crystalline-line growth line. The present application, by collecting in real time the sample image of the silicon rod in the growth process, and providing the detection area in the sample image, can, according to the grayscale-value curve of the detection area, determine the growth states of the crystalline lines of the silicon rod, which alleviates the affection on the detection of crystalline lines by the fluctuation of the diameter of the silicon rod and the unclarity of the features of the crystalline lines, thereby improving the accuracy and the efficiency of the detection on the crystalline lines, and has a simple operation.

A fifth aspect of the present disclosure provides a method for detecting a broken line, wherein the method comprises:
  processing a current frame of an acquired growth image of a single crystal and a previous one frame of the growth image, and obtaining a quantity of moving pixels in the current frame of the growth image; within a unit time, counting up to obtain a quantity of moving pixels in all of frames of the growth image and information of a single-crystal-growth duration; and according to the information, determining whether the single crystal has a broken line.

In the method for detecting a broken line, because the silicon rod has the crystalline lines in the axial direction that have clear features, and the crystalline lines are evenly distributed in the circumferential direction of the silicon rod, the moving pixels in the image frame are used to determine whether the single crystal has a constant-diameter broken line.

As compared with the method for determining whether a broken line exists according to the data feature difference of the crystalline-line plane height X, the method for detecting a broken line according to the present application can be adapted for the detection on a constant-diameter broken line in cases of fluctuation of the diameter of the crystalline silicon rod and unclarity of the crystalline-line features of the crystalline silicon rod, which can improve the detection accuracy, to determine accurately whether line breaking has happened.

In an embodiment, the step of processing each of the image frames, and obtaining the quantity of moving pixels in each of the image frames comprises: selecting an image measurement area; performing data processing to each of pixels within the image measurement area, and obtaining a velocity amplitude of each of the pixels; if the velocity amplitude of a pixel is greater than a preset threshold, determining the pixel to be a moving pixel; and counting up a quantity of the moving pixels within the image measurement area.

The optical-flow method refers to a method of, by using the variation of the pixels in an image sequence in the time domain and the correlation between consecutive frames, finding the correspondence between the previous one frame and the current frame, thereby calculating out the pixel movement information between the consecutive frames.

The particular optical-flow-method processing according to the present application particularly comprises: selecting one pixel in the current frame of the image; determining the coordinate-point position of the pixel; finding the pixel in the previous one frame of the image;
comparing to judge whether the coordinate-point position of the pixel has changed in the current frame; if the coordinate-point position has changed, expressing the changing by using a velocity amplitude, and comparing the velocity amplitude of the pixel with a preset threshold; if the velocity amplitude of the pixel is greater than the preset threshold, determining the pixel to be a moving pixel; and then counting up those moving pixels to obtain the sum.

The present application, by using the preset threshold, can cancel noise, improve the accuracy of the detection and determination, and not be affected by the fluctuation of the crystal diameter. When the features of the crystalline lines of the crystalline silicon rod are not clear, the present application can still identify out the moving pixels of the crystalline-line features, for the analysis and determination.

In an embodiment, the step of selecting the image measurement area comprises: according to a position of a light ring, selecting an image measurement area in each of the image frames. The light ring is located at the solid-liquid interface between the solid silicon and the molten silicon in the lower part of the monocrystalline silicon rod.

The light ring exists in all of the image frames, and in the present application the image measurement area is selected according to the position of the light ring, which facilitates to filter out the dark pixel points.

In an embodiment, the step of selecting the image measurement area comprises: according to a grayscale value, selecting an image measurement area in each of the image frames, wherein a maximum grayscale value is 200.

The image measurement area may also be selected according to the position of the light ring and the grayscale value, wherein the grayscale value should not exceed 200.

By setting the maximum grayscale value within the image measurement area to be 200, the effect of the optical-flow-method processing can be ensured.

In an embodiment, the step of performing data processing to the image measurement area, and obtaining the velocities of the pixels within the image measurement area and their corresponding amplitudes comprises:
acquiring a velocity in a first direction and a velocity in a second direction of an i-th pixel within the image measurement area; and
according to the velocity in the first direction, the velocity in the second direction and a first formula, obtaining the velocity amplitude of any point of the image within the image measurement area, wherein the first formula comprises:

$$\begin{cases} m_i = \sqrt{u^2 + v^2} * f(\theta_i), 0° \le \theta_i \le 360°, \text{ and } \theta_i \ne 90° \\ m_i = \sqrt{u^2 + v^2}, \theta_i = 90° \end{cases}$$

wherein i=1, 2, 3, . . . n, $m_i$ represents the velocity amplitude of the i-th pixel within the image measurement area, $\theta_i$ represents an included angle between the first direction and the second direction, $f(\theta_i)$ represents a function relation formula that is relevant to the $\theta_i$, $u_i$ represents the velocity in the first direction, and $v_i$ represents the velocity in the second direction.

In an embodiment, the step of acquiring the velocity in the first direction and the velocity in the second direction of the i-th pixel of the image within the image measurement area comprises: according to a coordinate-point position of the i-th pixel within the image measurement area, an image-collection time interval and a second formula, obtaining the velocity in the first direction and the velocity in the second direction of the i-th pixel within the image measurement area, wherein the second formula is: $(u_i, v_i) = [(x_{i2}, y_{i2}) - (x_{i1}, y_{i1})]/t$.

wherein x represents the first direction, y represents the second direction, $(x_{i1}, y_{i1})$ represents a coordinate-point position of the i-th pixel within the image measurement area at the (s−1)-th frame, $(x_{i2}, y_{i2})$ represents a coordinate-point position of the i-th pixel within the image measurement area at the s-th frame, and t represents the image-collection time interval between the s-th frame and the (s−1)-th frame.

In an embodiment, the preset threshold is obtained according to the velocity amplitudes of all of the pixels within the image measurement area, by the following step:
according to the velocity amplitudes of all of the pixels within the image measurement area, a quantity of the pixels within the image measurement area and a third formula, obtaining the preset threshold, wherein the third formula is:

$$Y = \frac{\sum_{1}^{k} M_g}{N};$$

wherein Y represents the preset threshold, $M_g$ represents a velocity amplitude of the g-th pixel within a coverage of the light ring, g=1, 2, 3, . . . k, and N represents a quantity of the pixels within the coverage of the light ring.

The preset threshold may be the average value of the velocity amplitudes of all of the pixels within the image measurement area. The preset threshold may also be set to be another value.

The present application, by using the preset threshold, can cancel noise, improve the accuracy of the detection and determination, and not be affected by the fluctuation of the crystal diameter. When the features of the crystalline lines of the crystalline silicon rod are not clear, the present application can still identify out the moving pixels of the crystal-line-line features, for the analysis and determination. Furthermore, by selecting the amplitudes of the pixels within the image measurement area, dark pixels can be filtered out, and in practical applications the moving pixels of the crystalline silicon rod can be filtered out, to maintain the feature of the crystalline line and the moving pixels of the light ring.

A sixth aspect of the present disclosure provides an apparatus for detecting a broken line, wherein the apparatus comprises:

an image processing module, configured for processing a current frame of an acquired growth image of a single crystal and a previous one frame of the growth image, and obtaining a quantity of moving pixels in the current frame of the growth image;

a counting-up module, configured for, within a unit time, counting up to obtain a quantity of moving pixels in all of frames of the growth image and information of a single-crystal-growth duration; and an affirming module, configured for, according to the information, determining whether the single crystal has a broken line.

In another embodiment, the image processing module comprises:

a selecting submodule, configured for selecting an image measurement area;

a data processing submodule, configured for performing data processing to each of pixels within the image measurement area, and obtaining a velocity amplitude of each of the pixels;

an affirming submodule, configured for, if the velocity amplitude of a pixel is greater than a preset threshold, determining the pixel to be a moving pixel;

a counting-up submodule, configured for counting up the quantity of the moving pixels; and a selecting submodule, configured for, according to a position of a light ring, selecting an image measurement area in each of the image frames.

The data processing submodule comprises:

an image acquiring unit, configured for acquiring a velocity in a first direction and a velocity in a second direction of an i-th pixel within the image measurement area; and a data processing subunit, configured for, according to the velocity in the first direction, the velocity in the second direction and a first formula, obtaining a velocity amplitude of the i-th pixel within the image measurement area, wherein the first formula comprises:

$$\begin{cases} m_i = \sqrt{u^2+v^2} * f(\theta_i), 0° \le \theta_i \le 360°, \text{ and } \theta_i \ne 90° \\ m_i = \sqrt{u^2+v^2}, \theta_i = 90° \end{cases}$$

wherein i=1, 2, 3, . . . n, $m_i$ represents the velocity amplitude of the i-th pixel within the image measurement area, $\theta_i$ represents an included angle between the first direction and the second direction, $f(\theta_i)$ represents a function relation formula that is relevant to the $\theta_i$, $u_i$, represents the velocity in the first direction, and $v_i$ represents the velocity in the second direction.

The image acquiring unit is configured for, according to a coordinate-point position of the i-th pixel within the image measurement area, an image-collection time interval and a second formula, obtaining the velocity in the first direction and the velocity in the second direction of the i-th pixel within the image measurement area, wherein the second formula is: $(u_i,v_i)=[(x_{i2},y_{i2})-(x_{i1},y_{i1})]/t$;

wherein x represents the first direction, y represents the second direction, $(x_{i1},y_{i1})$ represents a coordinate-point position of the i-th pixel within the image measurement area at the (s−1)-th frame, $(x_{i2},y_{i2})$ represents a coordinate-point position of the i-th pixel within the image measurement area at the s-th frame, and t represents the image-collection time interval between the s-th frame and the (s−1)-th frame.

The affirming submodule is configured for, according to the velocity amplitudes of all of the pixels within the image measurement area, a quantity of the pixels within the image measurement area and a third formula, obtaining the preset threshold, wherein the third formula is:

$$Y = \frac{\sum_{1}^{k} M_g}{N};$$

wherein Y represents the preset threshold, $M_g$ represents a velocity amplitude of the g-th pixel within a coverage of the light ring, g=1, 2, 3, . . . k, and N represents a quantity of the pixels within the coverage of the light ring.

A seventh aspect of the present disclosure provides a device for detecting a broken line, wherein the device comprises a second processor and a second memory, the second memory stores at least one instruction, and the instruction is loaded and executed by the second processor to implement the steps of the method for detecting a broken line.

An eighth aspect of the present disclosure provides a computer-readable storage medium, wherein the storage medium stores at least one instruction, and the instruction is loaded and executed by a second processor to implement the steps of the method for detecting a broken line.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

Description of the reference numbers: 101—silicon rod, 102—crucible, 103—molten silicon, 104—single crystal furnace, 105—crystalline line, 106—detection area, 107—predetermined direction, 401—interface, 402—first processor, 403—first memory, 404—bus, 108—light ring, 109—peak, 110—interval, 501—image processing module, 502—counting-up module, 503—affirming module, 5011—selecting submodule, 5012—data processing submodule, 5013—affirming submodule, 5014—counting-up submodule, 50121—image acquiring unit, 50122—data processing subunit, 601—receiver, 602—emitter, 603—second processor, and 604—second memory.

DETAILED DESCRIPTION

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

The First Embodiment

Figure 1:
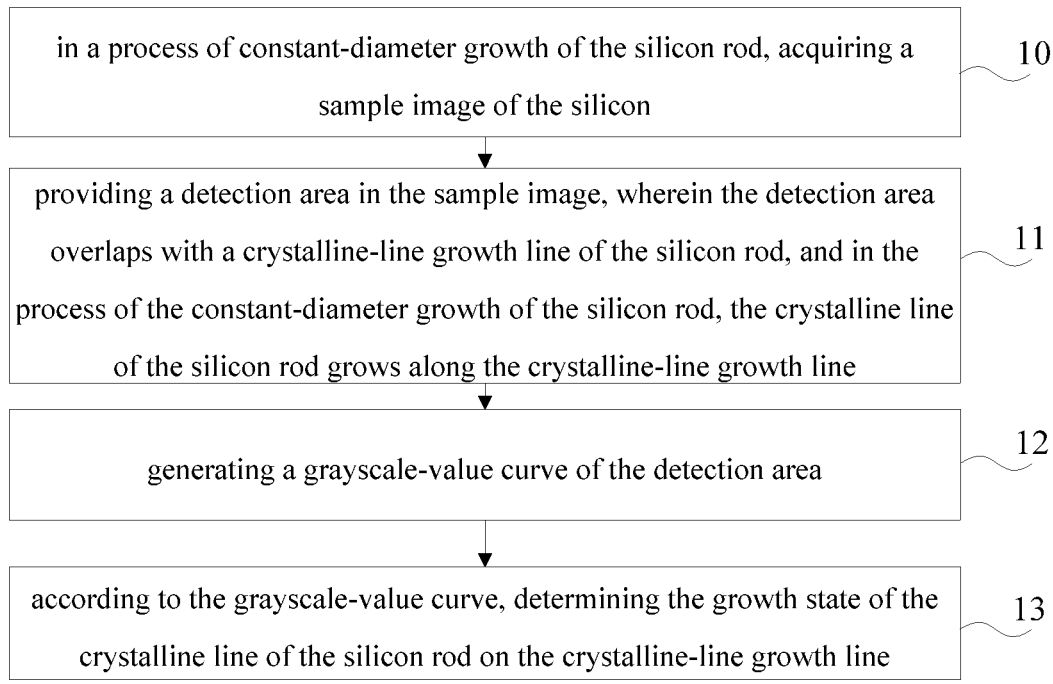
FIG. 1 shows a flow chart of the steps of the method for detecting a growth state of a crystalline line of a silicon rod according to the first embodiment of the present disclosure.

Referring to FIG. 1, FIG. 1 shows a flow chart of the steps of the method for detecting a growth state of a crystalline line of a silicon rod according to the first embodiment of the present disclosure. The method may comprise the following steps:

Step 10: in a process of constant-diameter growth of the silicon rod, acquiring a sample image of the silicon rod.

Figure 2:
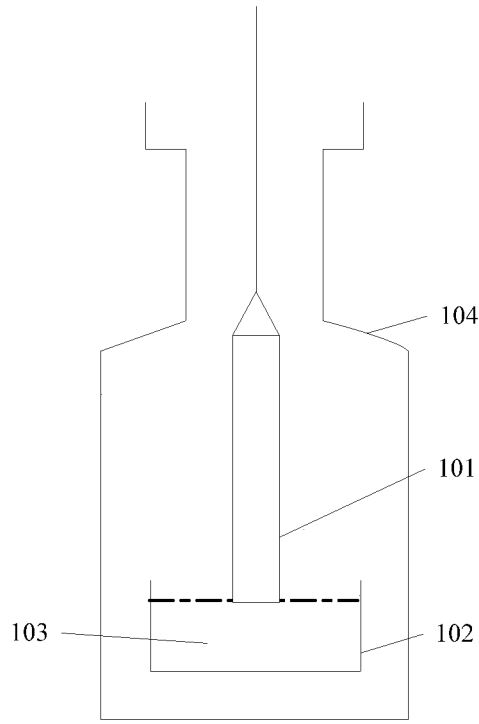
FIG. 2 shows a schematic diagram of the apparatus for fabricating a silicon rod according to the first embodiment of the present disclosure.

Referring to FIG. 2, FIG. 2 shows a schematic diagram of the apparatus for fabricating a silicon rod according to the first embodiment of the present disclosure.

In the embodiment of the present disclosure, when monocrystalline silicon is fabricated by using the czochralski method, by using a single crystal furnace 104, a high-purity polycrystalline-silicon material is melted in a quartz crucible 102, and the lower end of the single-crystal seed crystal is immerged into the liquid level of the molten silicon 103 in the quartz crucible. The lower end of the single-crystal seed crystal sequentially undergoes the processes of seeding, shouldering, shoulder circuiting, constant-diameter growth and ending, and simultaneously the single-crystal seed crystal and the crucible are rotated cooperatively, thereby completing the fabrication of the silicon rod 101.

Particularly, during the process of the constant-diameter growth, the silicon rod 101 is rotated with a certain period, and the process of the constant-diameter growth of the silicon rod 101 may be image-sampled with a certain sampling frequency, to acquire sample images of the silicon rod 101.

For example, if the period of rotation of the silicon rod is 6 seconds, and within the period of rotation, one frame of sample image is collected every 0.25 second, then 24 frames of the sample images can be collected within one period of rotation of the silicon rod.

Figure 3:
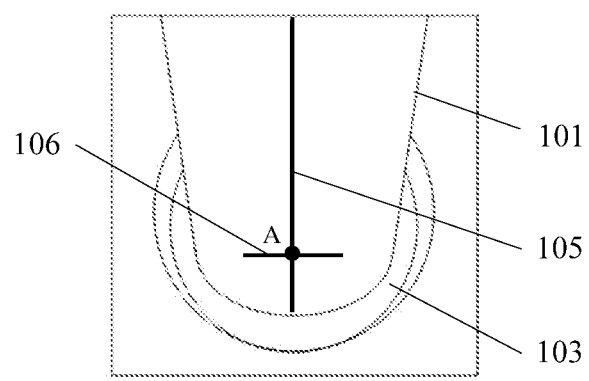
FIG. 3 shows a sample image of the silicon rod according to the first embodiment of the present disclosure.

Referring to FIG. 3, FIG. 3 shows a sample image of the silicon rod according to the first embodiment of the present disclosure. In the sample image, the lower end of the silicon rod 101 is immerged into the liquid level of the molten silicon 103, and the silicon rod 101 has on the surface one crystalline line 105 in the axial direction of the silicon rod.

In the embodiment of the present disclosure, the sample image of the silicon rod in the growth process may be collected by using an external shooting device. The sample image contains the information of the surface condition of the silicon rod with 180 degrees. Because in the process of the fabrication of the monocrystalline silicon rod the surface of the monocrystalline silicon rod in the process of the constant-diameter growth has 4 crystalline lines that are equidistantly distributed in the axial direction, in the collected sample image, there is at least one crystalline line, there may also be two crystalline lines.

Step 11: providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line.

In this step, in the collected sample image, a detection area used to detect the growth state of the crystalline line of the silicon rod is established. The detection area and the crystalline-line growth line of the silicon rod may be caused to have an overlapping part by setting the size of the detection area, and in the process of the constant-diameter growth of the silicon rod, the crystalline line of the silicon rod grows along the crystalline-line growth line.

Particularly, the crystalline-line growth line refers to the straight line where the continuous crystalline line is located on the surface of the monocrystalline silicon rod. If the silicon rod is a polycrystalline silicon rod, the crystalline line growing on its surface has breaking, but the crystalline line still grows along the crystalline-line growth line.

Particularly, the detection area may be a line segment perpendicular to the axial direction of the silicon rod, and may also be a rectangular area perpendicular to the axial direction of the silicon rod, wherein the plane of the rectangular area is perpendicular to the axial direction of the silicon rod.

Further, the detection area is provided in the silicon-rod image in the sample image.

Referring to FIG. 3, in the image of the silicon rod 101 in the sample image, a line segment perpendicular to the axial direction of the silicon rod 101 is provided as the detection area 106, and the detection area 106 intersects with the crystalline line 105 on the silicon rod 101 at the point A.

Step 12: generating a grayscale-value curve of the detection area.

In this step, according to the detection area in the sample image, a grayscale-value curve of the detection area is generated.

Particularly, after the detection area has been provided in the sample image, by starting from one end of the detection area, according to the grayscale values of all of the pixel points in the detection area, the grayscale-value curve of the detection area is generated.

Figure 4:
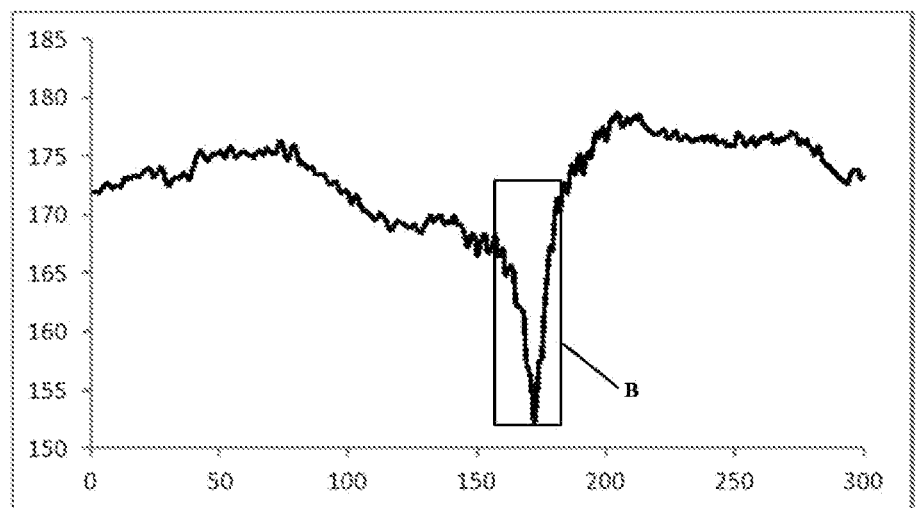
FIG. 4 shows a grayscale-value curve of a detection area according to the first embodiment of the present disclosure.

Referring to FIG. 4, FIG. 4 shows a grayscale-value curve of a detection area according to the first embodiment of the present disclosure. The horizontal axis of the grayscale-value curve represents the variation of the position of the detection area in the direction perpendicular to the axial direction of the silicon rod, and corresponds to the relative positions of each of the pixel points of the detection area, and the vertical axis represents the corresponding grayscale values of each of the pixel points of the detection area.

Step 13: according to the grayscale-value curve, determining the growth state of the crystalline line of the silicon rod on the crystalline-line growth line.

In this step, according to the grayscale-value curve corresponding to the detection area in the sample image of the silicon rod, the growth state at the moment of the crystalline line of the silicon rod can be determined, thereby determining whether, at the moment, the silicon rod is a monocrystalline silicon rod or a polycrystalline silicon rod.

Particularly, if the detection area of the sample image and the crystalline line of the silicon rod have an intersection part therebetween, that indicates that the grayscale-value curve corresponding to the detection area contains the grayscale value of the intersection part between the detection area and the crystalline line of the silicon rod. The crystalline line, as compared with the other areas of the surface of the silicon rod, has a darker color and a lower brightness, and therefore, the grayscale value corresponding to the crystalline line is lower than the grayscale value corresponding to the other areas of the surface of the silicon rod.

In the embodiment of the present disclosure, if the detection area of the sample image and the crystalline line of the silicon rod have an intersection part therebetween, the grayscale-value curve corresponding to the detection area has a part having a lower grayscale value. Referring to FIG. 4, FIG. 4 shows a grayscale-value curve of a detection area according to the first embodiment of the present disclosure. The grayscale-value curve is the grayscale-value curve corresponding to the detection area 106 in FIG. 3. The rectangular line block B in the figure corresponds to the grayscale-value curve of the pixel points adjacent to the point A where the detection area 106 and the crystalline line 105 intersect. In the grayscale-value curve, except for the part surrounded by the rectangular line block B, all of the grayscale value are between 165-180, but the grayscale values of the part surrounded by the rectangular line block B are between 152-170, which indicates that the grayscale values of the pixel points on the silicon rod 101 in the detection area 106 are higher, and the grayscale values of the pixel points adjacent to the point A on the crystalline line 105 in the detection area 106 are lower.

The grayscale value refers to the color depth of a point in a black-and-white image. Because the colors and the brightnesses of the points of an object are different, the points on a corresponding black-and-white photograph present grayscales of varying degrees. The range between the white color and the black color may be graded into multiple levels according to the logarithmic relation, which are referred to as "gray scale", and have a range generally from 0 to 255, wherein the white color is 255, and the black color is 0.

Therefore, whether the detection area and the crystalline line have an intersection part may be determined according to the grayscale-value curve of the corresponding detection area. If the grayscale-value curve of the detection area has relatively low grayscale values at a certain part, that indicates that the detection area and the crystalline line have an intersection part at that area, which indicates that at the moment the growth state of the crystalline line on the surface of the silicon rod is the continued state.

Further, if, within one period of rotation of the silicon rod, it is detected that all of the growth states of the crystalline lines in each of the collected sample images are the continued state, it can be determined that, within the period of rotation of the silicon rod, the surface of the silicon rod has 4 crystalline lines that are continuously growing, and at the moment the silicon rod is a monocrystalline silicon rod.

If the grayscale-value curve of the detection area does not have a relatively large fluctuation, and the variation of its grayscale values in the vertical axis is always within a small range, that indicates that the detection area and the crystalline line do not have an intersection part, which indicates that at the moment the growth state of the crystalline line on the surface of the silicon rod is the line-breaking state.

Further, if, within one period of rotation of the silicon rod, it is detected that all of the growth states of the crystalline lines in one of the collected sample images are the line-breaking state, it can be determined that, within the period of rotation of the silicon rod, the surface of the silicon rod does not have 4 crystalline lines that are continuously growing, and at the moment the silicon rod is a polycrystalline silicon rod.

The method for detecting a growth state of a crystalline line of a silicon rod according to the embodiment of the present disclosure comprises: in a process of constant-diameter growth of the silicon rod, acquiring a sample image of the silicon rod; providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line; generating a grayscale-value curve of the detection area; and according to the grayscale-value curve, determining the growth state of the crystalline line of the silicon rod on the crystalline-line growth line. The present application, by collecting in real time the sample image of the silicon rod in the growth process, and providing the detection area in the sample image, can, according to the grayscale-value curve of the detection area, determine the growth states of the crystalline lines of the silicon rod, thereby determining whether the silicon rod is a monocrystalline silicon rod. The method alleviates the affection on the detection of crystalline lines by the fluctuation of the diameter of the silicon rod and the unclarity of the features of the crystalline lines, thereby improving the accuracy and the efficiency of the detection on the crystalline lines, and has a simple operation.

The Second Embodiment

Figure 5:
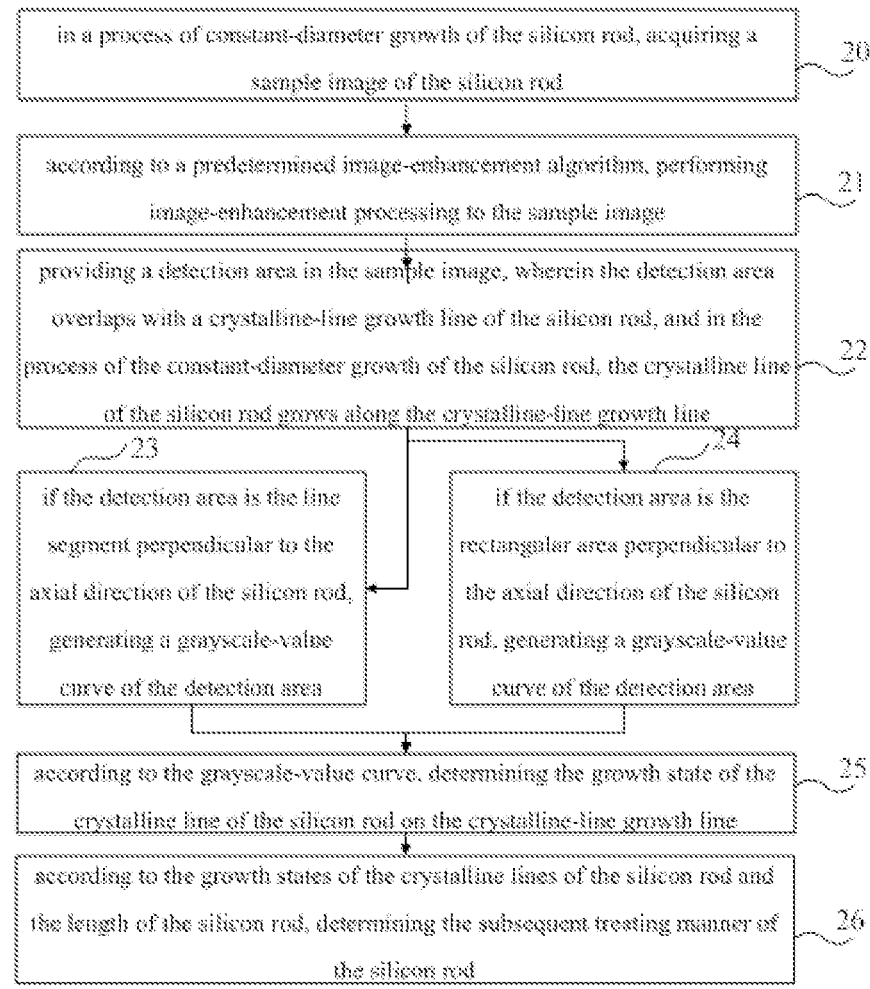
FIG. 5 shows a flow chart of the steps of the method for detecting a growth state of a crystalline line of a silicon rod according to the second embodiment of the present disclosure.

Referring to FIG. 5, FIG. 5 shows a flow chart of the steps of the method for detecting a growth state of a crystalline line of a silicon rod according to the second embodiment of the present disclosure. The method may comprise the following steps:

Step 20: in a process of constant-diameter growth of the silicon rod, acquiring a sample image of the silicon rod.

This step may particularly refer to the above step 10, and is not discussed here further.

Step 21: according to a predetermined image-enhancement algorithm, performing image-enhancement processing to the sample image.

In this step, image enhancement may be performed to the sample image of the silicon rod, to enhance the feature of the crystalline line in the sample image, and enlarge the difference between the crystalline line and the other areas in the sample image, which facilitates to improve the accuracy of the determination of the growth state of the crystalline line according to the grayscale-value curve corresponding to the detection area in the sample image.

The image-enhancement algorithm may comprise performing median filtering, maximum filtering, minimum filtering and so on to the sample image. In the embodiment of the present disclosure, that is not particularly limited.

Step 22: providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line.

In this step, in the collected sample image, a detection area used to detect the growth state of the crystalline line of the silicon rod is established, wherein the detection area overlaps with a crystalline-line growth line of the silicon rod, and in the process of the constant-diameter growth of the silicon rod, the crystalline line of the silicon rod grows along the crystalline-line growth line.

Optionally, in an implementation of the embodiment of the present disclosure, the step 22 may particularly comprise:

Sub-step 221: providing a detection area in the sample image, wherein the detection area is a line segment perpendicular to the axial direction of the silicon rod.

Figure 6:
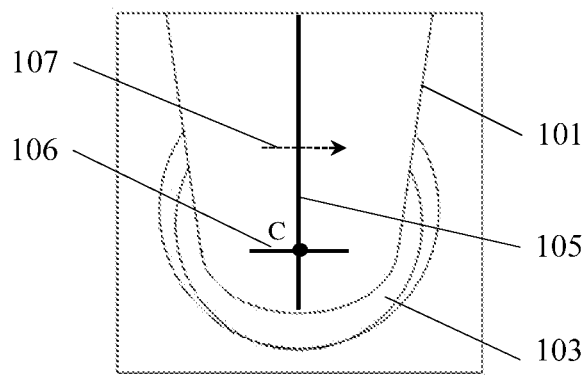
FIG. 6 shows a schematic diagram of the detection area of a silicon rod according to the second embodiment of the present disclosure.

Referring to FIG. 6, FIG. 6 shows a schematic diagram of the detection area of a silicon rod according to the second embodiment of the present disclosure. The detection area 106 is a line segment perpendicular to the axial direction of the silicon rod 101, and the line segment intersects with the crystalline line 105 of the silicon rod 101 at the point C.

Optionally, the length of the line segment may be a preset pixel quantity, for example 500 pixels.

if the detection area is the line segment perpendicular to the axial direction of the silicon rod, the step 23 is executed.

Optionally, in another implementation of the embodiment of the present disclosure, the step 22 may particularly comprise:

Sub-step 222: providing a detection area in the sample image, wherein the detection area is a rectangular area perpendicular to an axial direction of the silicon rod, wherein a plane of the rectangular area is perpendicular to the axial direction of the silicon rod.

Figure 7:
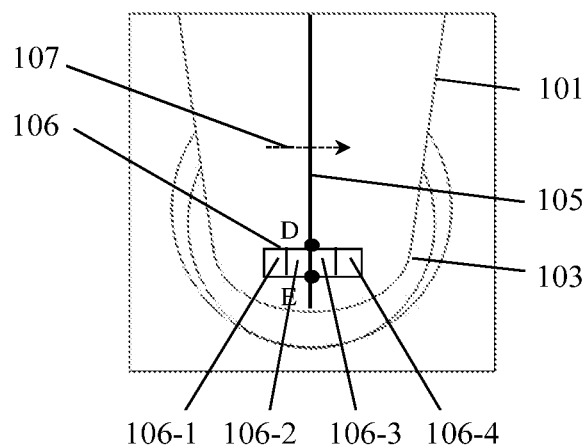
FIG. 7 shows a schematic diagram of the detection area of another silicon rod according to the second embodiment of the present disclosure.

Referring to FIG. 7, FIG. 7 shows a schematic diagram of the detection area of another silicon rod according to the second embodiment of the present disclosure. The detection area 106 is a rectangular area perpendicular to the axial direction of the silicon rod 101, and the intersection part between the rectangular area and the crystalline line 105 of the silicon rod 101 is a line segment DE.

Optionally, the length and the width of the rectangular area may be preset pixel quantities, for example 500 pixels×5 pixels.

In the embodiment of the present disclosure, the detection area is set to be a rectangular area, whereby, when the crystalline line exists, the overlapping part between the crystalline line and the rectangular area is large, which, as compared with the case in which the overlapping part between the crystalline line and the detection area as a line segment is merely one intersection point, can reduce the influence on the checking result by environmental factors, thereby improving the accuracy of the detection result.

if the detection area is the rectangular area perpendicular to the axial direction of the silicon rod, the step 24 is executed.

Step 23: if the detection area is the line segment perpendicular to the axial direction of the silicon rod, generating a grayscale-value curve of the detection area.

In this step, a line segment perpendicular to the axial direction of the silicon rod is provided in the sample image as the detection area, and by starting from one end of the line segment, according to the grayscale values of all of the pixel points in the line segment, a grayscale-value curve along the line segment is generated.

Referring to FIG. 6, by starting from the left end of the detection area (line segment) 106, in the predetermined direction 107, a grayscale-value curve of the detection area (line segment) 106 is generated.

Step 24: if the detection area is the rectangular area perpendicular to the axial direction of the silicon rod, generating a grayscale-value curve of the detection area.

In this step, a rectangular area perpendicular to the axial direction of the silicon rod is provided in the sample image as the detection area, and the step of generating a grayscale-value curve corresponding to the rectangular area particularly comprises:

Sub-step 241: by starting from one end of the rectangular area, dividing the rectangular area into a plurality of identical sub-areas.

In this step, by starting from one end of the rectangular area, the rectangular area is divided into a plurality of sub-areas of the identical size, wherein the quantity of the sub-areas may be a preset constant numerical value.

Referring to FIG. 7, by starting from the left end of the detection area (rectangular area) 106, in the predetermined direction 107, the detection area (rectangular area) 106 is divided into a plurality of sub-areas 106-1, 106-2, 106-3, 106-4 of the same size.

For example, if the size of the rectangular area is 500 pixels×5 pixels, the rectangular area may be divided in the direction perpendicular to the axial direction of the silicon rod into 100 sub-areas of 5 pixels×5 pixels.

Sub-step 242: calculating an average grayscale value of each of the sub-areas.

In this step, after the rectangular area is divided into a plurality of identical sub-areas, the grayscale values of all of the pixel points within each of the sub-areas are acquired, and the grayscale values of all of the pixel points within the sub-area are averaged, to calculate to obtain the average grayscale value of the sub-area.

Sub-step 243: according to the average grayscale values of all of the sub-areas, generating a grayscale-value curve corresponding to the rectangular area.

In this step, the average grayscale value of the sub-area is used as the grayscale value corresponding to the sub-area, and according to the grayscale values of each of the sub-areas, the grayscale-value curve of the rectangular area in the direction perpendicular to the axial direction of the silicon rod is generated.

For example, if the size of the rectangular area is 500 pixels×5 pixels, and the sub-areas are 100 identical square areas of 5 pixels×5 pixels in the direction perpendicular to the axial direction of the silicon rod, according to the average grayscale values of the 100 sub-areas, the grayscale-value curve of the rectangular area in the direction perpendicular to the axial direction of the silicon rod is generated.

Step 25: according to the grayscale-value curve, determining the growth state of the crystalline line of the silicon rod on the crystalline-line growth line.

Optionally, in an implementation of the embodiment of the present disclosure, the step 25 may particularly comprise:

Sub-step 251: according to the grayscale-value curve, calculating a variance value of the grayscale values in the grayscale-value curve.

In this step, according to the grayscale-value curve of the detection area, the variance value of the grayscale values in the grayscale-value curve is calculated, and the variance value of the grayscale values is compared with a preset variance-value threshold.

If the variance value of the grayscale values of the grayscale-value curve is greater than or equal to the variance-value threshold, the sub-step 252 is executed. If the variance value of the grayscale values is less than the variance-value threshold, the sub-step 253 is executed.

Figure 8:
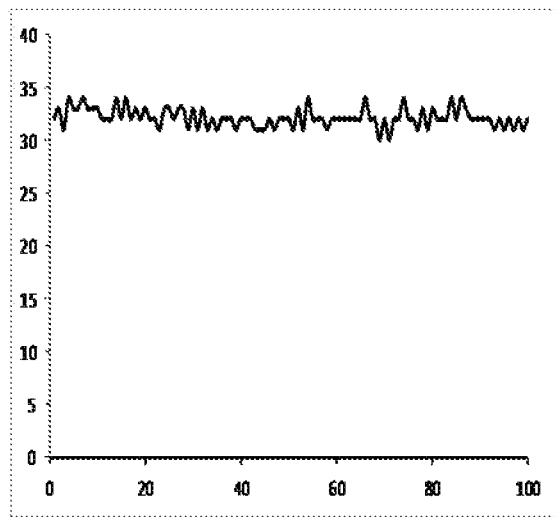
FIG. 8 shows a grayscale-value curve of a detection area according to the second embodiment of the present disclosure.

Referring to FIG. 8, FIG. 8 shows a grayscale-value curve of a detection area according to the second embodiment of the present disclosure. The range of the grayscale values of the grayscale-value curve in FIG. 8 is 25-30, and the corresponding variance value of the grayscale values is small.

Figure 9:
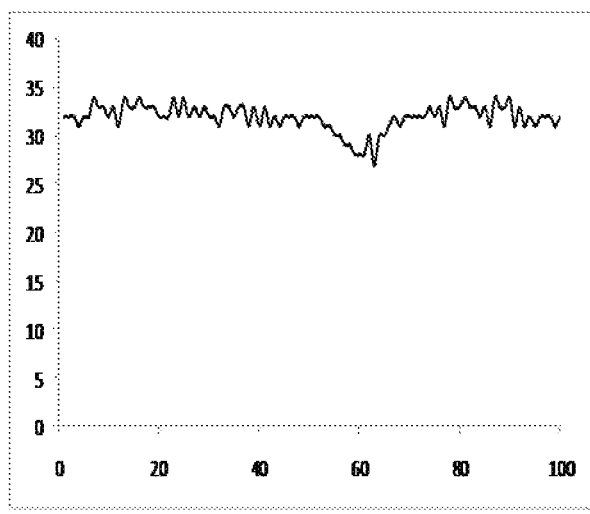
FIG. 9 shows a grayscale-value curve of another detection area according to the second embodiment of the present disclosure.

Referring to FIG. 9, FIG. 9 shows a grayscale-value curve of another detection area according to the second embodiment of the present disclosure. The range of the grayscale values of the grayscale-value curve in FIG. 9 is 25-39, and the corresponding variance value of the grayscale values is large.

Sub-step 252: if the variance value of the grayscale values is greater than or equal to a variance-value threshold, determining the growth state to be a continued state.

In this step, if the variance value of the grayscale values of the grayscale-value curve is greater than or equal to the variance-value threshold, that indicates that the grayscale-value curve corresponding to the detection area has a part having a lower grayscale value. In other words, the detection area of the sample image and the crystalline line of the silicon rod have an intersection part therebetween, and in turn, that indicates that at the moment a crystalline line is detected in the detection area of the sample image.

Preferably, the variance value of the grayscale values may be 7.5.

Sub-step 253: if the variance value of the grayscale values is less than the variance-value threshold, determining the growth state to be a line-breaking state.

In this step, if the variance value of the grayscale values is less than the variance-value threshold, that indicates that the grayscale-value curve of the detection area does not have a relatively large fluctuation, and the variation of its grayscale values in the vertical axis is always within a small range. In other words, the detection area of the sample image and the crystalline line do not have an intersection part therebetween, which indicates that at the moment any crystalline line is not detected in the detection area of the sample image.

Preferably, the variance value of the grayscale values may be 7.5.

In the embodiment of the present disclosure, simply by calculating the variance value of the grayscale values, and comparing with a preset variance-value threshold, the growth state of the crystalline line of the silicon rod can be determined, and, further, whether the silicon rod is a monocrystalline silicon rod can be determined, which has a simple process.

Optionally, in another implementation of the embodiment of the present disclosure, the step 25 may particularly comprise:

Sub-step 254: if the grayscale-value curve has a crystalline-line characteristic peak, determining the growth state to be a continued state.

In this step, wave-trough detection algorithm may be used to determine whether the grayscale-value curve has a crystalline-line characteristic peak.

Optionally, the wave-trough detection algorithm may comprise firstly detecting the minimum grayscale value of the grayscale-value curve and the average grayscale value of the grayscale-value curve, determining the horizontal-axis coordinates in the grayscale-value curve corresponding to the minimum grayscale value and the average grayscale value, using the difference between the average grayscale value and the minimum grayscale value as the amplitude of the crystalline-line characteristic peak, and using the difference between the horizontal-axis coordinates in the grayscale-value curve corresponding to the minimum grayscale value and the average grayscale value as the width of the crystalline-line characteristic peak.

Further, the algorithm may comprise, according to the amplitude and the width of the crystalline-line characteristic peak, determining whether the grayscale-value curve has the crystalline-line characteristic peak.

If the amplitude of the crystalline-line characteristic peak is greater than or equal to a preset amplitude and the width of the crystalline-line characteristic peak is less than or equal to a preset width value, it can be determined that the grayscale-value curve has the crystalline-line characteristic peak.

Preferably, the preset amplitude may be 10, and the preset width value may be 20 pixels. In the embodiment of the present disclosure, those are not particularly limited.

Figure 10:
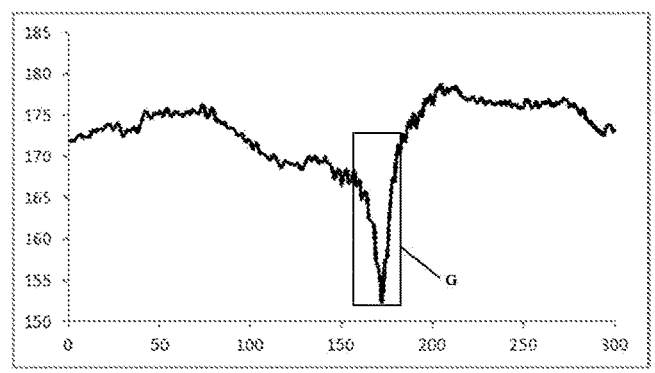
FIG. 10 shows a grayscale-value curve of another detection area according to the second embodiment of the present disclosure.

Referring to FIG. 10, FIG. 10 shows a grayscale-value curve of another detection area according to the second embodiment of the present disclosure. The grayscale-value curve in FIG. 10 has a crystalline-line characteristic peak, wherein the part in the figure identified by the rectangular line block G is the crystalline-line characteristic peak, which indicates that the grayscale-value curve corresponding to the detection area has a part having a lower grayscale value. In other words, the detection area of the sample image and the crystalline line of the silicon rod have an intersection part therebetween, and in turn, that indicates that at the moment a crystalline line is detected in the detection area of the sample image; in other words, at the moment the growth state of the crystalline line on the surface of the silicon rod is the continued state.

Further, if, within one period of rotation of the silicon rod, it is detected that all of the growth states of the crystalline lines in each of the collected sample images are the continued state, it can be determined that, within the period of rotation of the silicon rod, the surface of the silicon rod has 4 crystalline lines that are continuously growing, and at the moment the silicon rod is a monocrystalline silicon rod.

Sub-step 255: if the grayscale-value curve does not have the crystalline-line characteristic peak, determining the growth state to be a line-breaking state.

In this step, wave-trough detection algorithm may be used to determine whether the grayscale-value curve has a crystalline-line characteristic peak.

Optionally, the wave-trough detection algorithm may comprise firstly detecting the minimum grayscale value of the grayscale-value curve and the average grayscale value of the grayscale-value curve, determining the horizontal-axis coordinates in the grayscale-value curve corresponding to the minimum grayscale value and the average grayscale value, wherein the horizontal-axis coordinates correspond to the positions of the pixel points corresponding to the minimum grayscale value and the average grayscale value of the grayscale-value curve, using the difference between the average grayscale value and the minimum grayscale value as the amplitude of the crystalline-line characteristic peak, and using the difference between the horizontal-axis coordinates in the grayscale-value curve corresponding to the minimum grayscale value and the average grayscale value as the width of the crystalline-line characteristic peak.

Further, the algorithm may comprise, according to the amplitude and the width of the crystalline-line characteristic peak, determining whether the grayscale-value curve has the crystalline-line characteristic peak.

If the amplitude of the crystalline-line characteristic peak is less than a preset amplitude or the width of the crystalline-line characteristic peak is greater than a preset width value, it can be determined that the grayscale-value curve does not have the crystalline-line characteristic peak.

Preferably, the preset amplitude may be 10, and the preset width value may be 20 pixels. In the embodiment of the present disclosure, those are not particularly limited.

Figure 11:
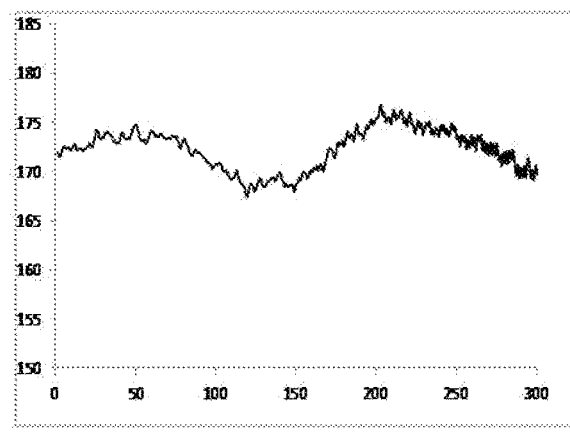
FIG. 11 shows a grayscale-value curve of another detection area according to the second embodiment of the present disclosure.

Referring to FIG. 11, FIG. 11 shows a grayscale-value curve of another detection area according to the second embodiment of the present disclosure. The grayscale-value curve in FIG. 11 does not have a crystalline-line characteristic peak. That indicates that the grayscale-value curve of the detection area does not have a relatively large fluctuation, and the variation of its grayscale values in the vertical axis is always within a small range, in other words, the detection area of the sample image and the crystalline line do not have an intersection part therebetween, which indicates that at the moment any crystalline line is not detected in the detection area of the sample image; in other words, at the moment the growth state of the crystalline line on the surface of the silicon rod is the line-breaking state.

Further, if, within one period of rotation of the silicon rod, it is detected that all of the growth states of the crystalline lines in one of the collected sample images are the line-breaking state, it can be determined that, within the period of rotation of the silicon rod, the surface of the silicon rod does not have 4 crystalline lines that are continuously growing, and at the moment the silicon rod is a polycrystalline silicon rod.

Therefore, whether the detection area and the crystalline line have an intersection part may be determined according to the grayscale-value curve of the corresponding detection area. If the grayscale-value curve of the detection area has a crystalline-line characteristic peak at a certain part, that indicates that the detection area and the crystalline line have an intersection part at that area. At the moment, the crystalline line is continuously growing on the surface of the silicon rod, and the growth state of the crystalline line of the silicon rod is the continued state. If the grayscale-value curve of the detection area does not have a crystalline-line characteristic peak, that indicates that the detection area and the crystalline line do not have an intersection part. At the moment, the crystalline line is broken on the surface of the silicon rod, and the growth state of the crystalline line of the silicon rod is the line-breaking state.

In the embodiment of the present disclosure, by determining whether the grayscale-value curve of the detection area has a crystalline-line characteristic peak, the growth state of the crystalline line of the silicon rod can be determined, and, further, whether the silicon rod is a monocrystalline silicon rod can be determined, which has a simple process, and a high detection accuracy.

Figure 12:
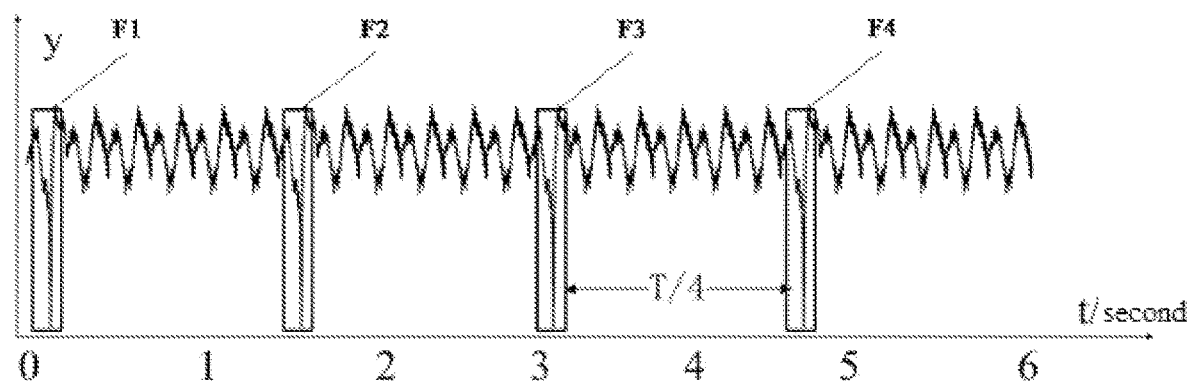
FIG. 12 shows a schematic diagram of the crystalline-line detection result of a silicon rod according to the present disclosure.

For example, referring to FIG. 12, FIG. 12 shows a schematic diagram of the crystalline-line detection result of a silicon rod according to the present disclosure. In the detection result, the period of rotation T of the silicon rod is 6 seconds, and if the collecting frequency of the sample images is 1.5 seconds, within one period of rotation T, four sample images can be collected. By composing the grayscale-value curves corresponding to the detection area in the four sample images, the grayscale-value curve within one period of rotation T, as shown in FIG. 12, is obtained. In the grayscale-value curve, within each of the time periods of T/4, one crystalline-line characteristic peak is detected in the grayscale-value curve, which are F1, F2, F3 and F4, and it is detected that the time intervals between the crystalline-line characteristic peaks are the same. That indicates that four continuous crystalline lines are evenly distributed on the silicon rod, and therefore at the moment the silicon rod is a monocrystalline silicon rod.

Figure 13:
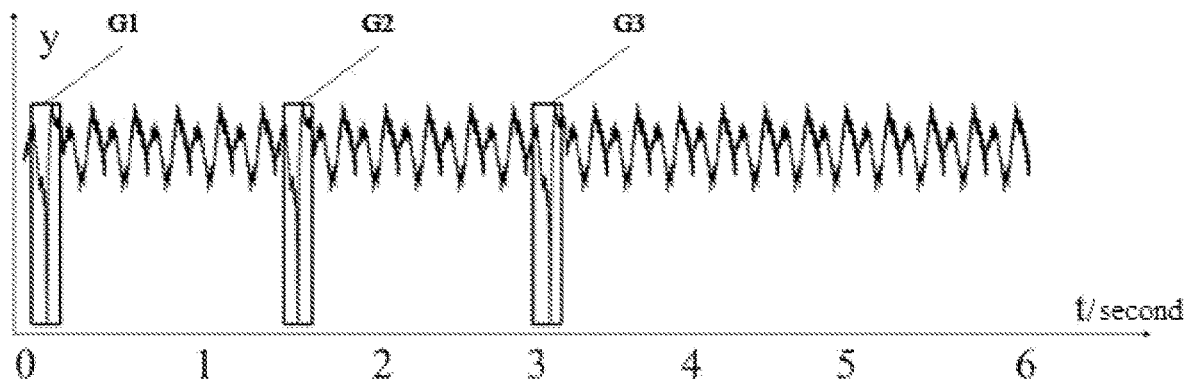
FIG. 13 shows a schematic diagram of the crystalline-line detection result of another silicon rod according to the present disclosure.

Referring to FIG. 13, FIG. 13 shows a schematic diagram of the crystalline-line detection result of another silicon rod according to the present disclosure. In the detection result, the period of rotation T of the silicon rod is 6 seconds, and if the collecting frequency of the sample images is 1.5 seconds, within one period of rotation T, four sample images can be collected. By composing the grayscale-value curves corresponding to the detection area in the four sample images, the grayscale-value curve within one period of rotation T, as shown in FIG. 13, is obtained. In the grayscale-value curve, within the first three of the time periods of T/4, one crystalline-line characteristic peak is detected in the grayscale-value curve, which are G1, G2 and G3, and it is detected that the time intervals between the crystalline-line characteristic peaks are the same. However, within the fourth time period of T/4, no crystalline-line characteristic peak is detected. That indicates that the silicon rod has merely three continuous crystalline lines, and therefore at the moment the silicon rod is a polycrystalline silicon rod.

Step 26: according to the growth states of the crystalline lines of the silicon rod and the length of the silicon rod, determining the subsequent treating manner of the silicon rod.

In this step, the subsequent treating manner of the silicon rod in the process of producing the silicon rod may be determined according to the growth states of the crystalline lines of the silicon rod and the length of the silicon rod.

Particularly, if it is determined, according to the growth states of the crystalline lines of the silicon rod, that the silicon rod is a monocrystalline silicon rod, the fabrication of the monocrystalline silicon is continued.

If it is determined, according to the growth states of the crystalline lines of the silicon rod, that the silicon rod is a polycrystalline silicon rod, the subsequent treating manner of the silicon rod may be determined by referring to the length of the silicon rod at the moment.

In the embodiment of the present disclosure, after it has been determined that the silicon rod is a polycrystalline silicon rod, if it is detected that at the moment the length of the silicon rod is greater than or equal to 500 millimeters, the production is ended, the silicon rod is cut, and the silicon rod obtained by the cutting may be used as a relative product. If it is detected that at the moment the length of the silicon rod is less than 500 millimeters, the production is ended, the silicon rod is melted, and the obtained molten silicon may be used as the raw material for the fabrication of a monocrystalline silicon rod.

The method for detecting a growth state of a crystalline line of a silicon rod according to the embodiment of the present disclosure comprises: in a process of constant-diameter growth of the silicon rod, acquiring a sample image of the silicon rod; providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line; generating a grayscale-value curve of the detection area; and according to the grayscale-value curve, determining the growth state of the crystalline line of the silicon rod on the crystalline-line growth line. The present application, by collecting in real time the sample image of the silicon rod in the growth process, and providing the detection area in the sample image, can, according to the grayscale-value curve of the detection area, determine the growth states of the crystalline lines of the silicon rod, thereby determining whether the silicon rod is a monocrystalline silicon rod. The method alleviates the affection on the detection of crystalline lines by the fluctuation of the diameter of the silicon rod and the unclarity of the features of the crystalline lines, thereby improving the accuracy and the efficiency of the detection on the crystalline lines, and has a simple operation.

It should be noted that, regarding the process embodiments, for brevity of the description, all of them are expressed as the combination of a series of actions, but a person skilled in the art should know that the embodiments of the present application are not limited by the sequences of the actions that are described, because according to the embodiments of the present application, some of the steps may have other sequences or be performed simultaneously. Secondly, a person skilled in the art should also know that all of the embodiments described in the description are preferable embodiments, and not all of the actions that they involve are required by the embodiments of the present application.

The Third Embodiment

Figure 14:
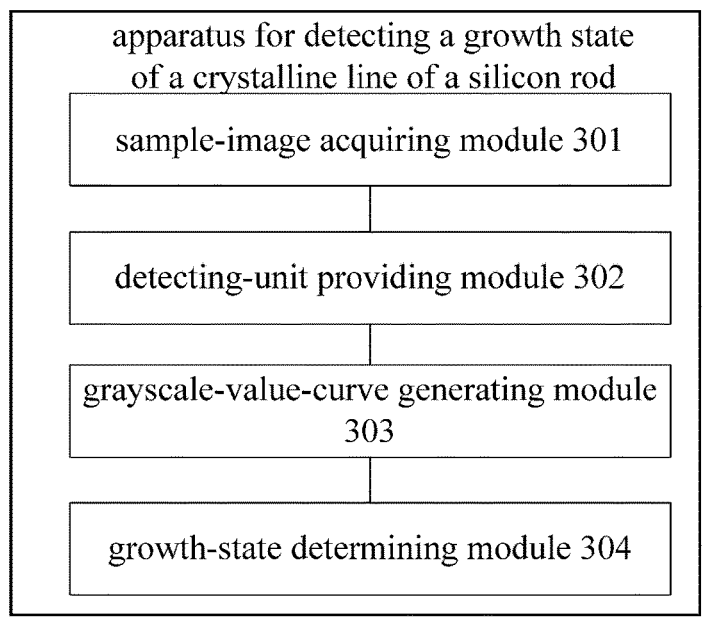
FIG. 14 shows a structural block diagram of the apparatus for detecting a growth state of a crystalline line of a silicon rod according to the third embodiment of the present disclosure.

Referring to FIG. 14, FIG. 14 shows a structural block diagram of the apparatus for detecting a growth state of a crystalline line of a silicon rod according to the third embodiment of the present disclosure. The apparatus may particularly comprise:

a sample-image acquiring module 301, configured for, in a process of constant-diameter growth of the silicon rod, acquiring a sample image of the silicon rod; and a detecting-unit providing module 302, configured for providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line;

wherein, optionally, the detection area comprises: a line segment perpendicular to an axial direction of the silicon rod, or a rectangular area perpendicular to an axial direction of the silicon rod, wherein a plane of the rectangular area is perpendicular to the axial direction of the silicon rod; and a grayscale-value-curve generating module 303, configured for generating a grayscale-value curve of the detection area.

Optionally, if the detection area is the line segment perpendicular to the axial direction of the silicon rod, the grayscale-value-curve generating module 303 comprises:

a first generating submodule, configured for, by starting from one end of the line segment, generating a grayscale-value curve corresponding to the line segment.

Optionally, if the detection area is the rectangular area perpendicular to the axial direction of the silicon rod, the grayscale-value-curve generating module 303 comprises:

a dividing submodule, configured for, by starting from one end of the rectangular area, dividing the rectangular area into a plurality of identical sub-areas;

a first calculating submodule, configured for calculating an average grayscale value of each of the sub-areas; and a second generating submodule, configured for, according to the average grayscale values of all of the sub-areas, generating a grayscale-value curve corresponding to the rectangular area.

a growth-state determining module 304, configured for, according to the grayscale-value curve, determining the growth state of the crystalline line of the silicon rod on the crystalline-line growth line.

Optionally, the growth-state determining module 304 comprises:

a second calculating submodule, configured for, according to the grayscale-value curve, calculating a variance value of the grayscale values in the grayscale-value curve;

a first determining submodule, configured for, if the variance value of the grayscale values is greater than or equal to a variance-value threshold, determining the growth state to be a continued state; and a second determining submodule, configured for, if the variance value of the grayscale values is less than the variance-value threshold, determining the growth state to be a line-breaking state.

Optionally, the growth-state determining module 304 may further comprise:

a third determining submodule, configured for, if the grayscale-value curve has a crystalline-line characteristic peak, determining the growth state to be a continued state; and a fourth determining submodule, configured for, if the grayscale-value curve does not have the crystalline-line characteristic peak, determining the growth state to be a line-breaking state.

Optionally, the apparatus may further comprise:

an enhancing module, configured for, according to a predetermined image-enhancement algorithm, performing image-enhancement processing to the sample image.

The apparatus for detecting a growth state of a crystalline line of a silicon rod according to the embodiment of the present disclosure comprises: in a process of constant-diameter growth of the silicon rod, acquiring a sample image of the silicon rod; providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line; generating a grayscale-value curve of the detection area; and according to the grayscale-value curve, determining the growth state of the crystalline line of the silicon rod on the crystalline-line growth line. The present application, by collecting in real time the sample image of the silicon rod in the growth process, and providing the detection area in the sample image, can, according to the grayscale-value curve of the detection area, determine the growth states of the crystalline lines of the silicon rod, thereby determining whether the silicon rod is a monocrystalline silicon rod. The method alleviates the affection on the detection of crystalline lines by the fluctuation of the diameter of the silicon rod and the unclarity of the features of the crystalline lines, thereby improving the accuracy and the efficiency of the detection on the crystalline lines, and has a simple operation.

Figure 15:
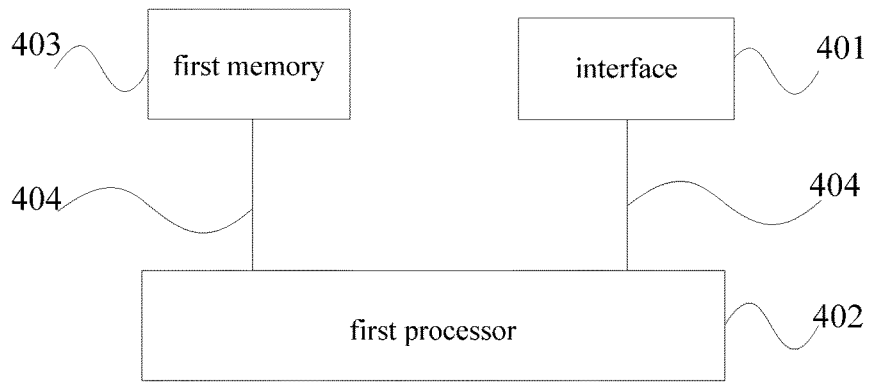
FIG. 15 shows a schematic diagram of the logical structure of the device for detecting a growth state of a crystalline line of a silicon rod according to an embodiment of the present disclosure.

FIG. 15 shows a schematic diagram of the logical structure of the device for detecting a growth state of a crystalline line of a silicon rod according to an embodiment of the present disclosure. As shown in FIG. 15, the device for detecting a growth state of a crystalline line of a silicon rod according to the embodiment of the present disclosure may comprise: an interface 401, a first processor 402, a first memory 403 and a bus 404. The bus 404 is configured to realize the connection and communication between the interface 401, the first processor 402 and the first memory 403. The first memory 403 stores an executable program. The first processor 402 is configured to execute the executable program stored in the first memory 403 to implement the steps of the method for detecting a growth state of a crystalline line of a silicon rod according to FIG. 1 or FIG. 5, or the first embodiment or the second embodiment, to reach the same or similar effects, which, in order to avoid replication, is not discussed here further.

The present disclosure further provides a computer-readable storage medium. The computer-readable storage medium stores one or more executable programs. The one or more executable programs may be executed by one or more first processors to implement the steps of the method for detecting a growth state of a crystalline line of a silicon rod according to FIG. 1 or FIG. 5, or the first embodiment or the second embodiment, to reach the same or similar effects, which, in order to avoid replication, is not discussed here further.

The Fourth Embodiment

Figure 16:
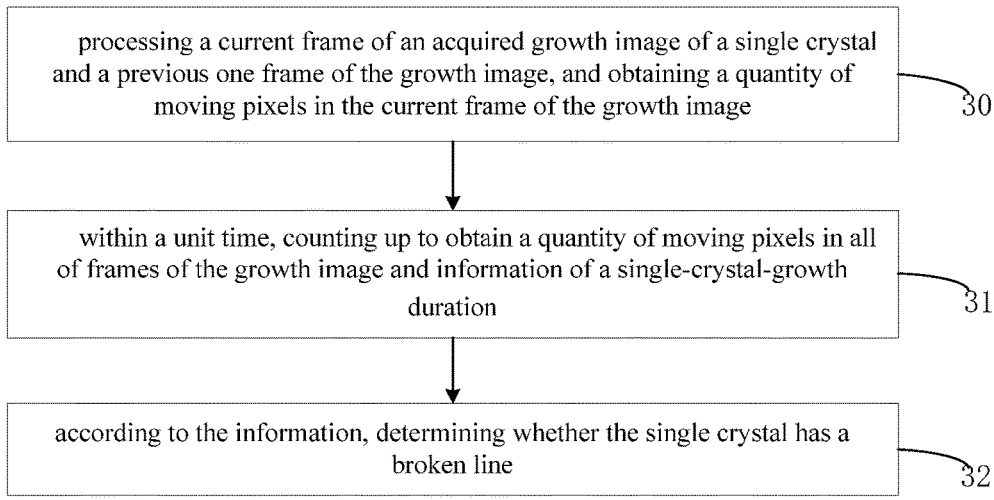
FIG. 16 is a flow chart of the method for detecting a broken line according to the fourth embodiment of the present disclosure.

An embodiment of the present disclosure provides a method for detecting a broken line. As shown in FIG. 16, the method comprises:

Step 30: by using the optical-flow method, processing a current frame of an acquired growth image of a single crystal and a previous one frame of the growth image, and obtaining a quantity of moving pixels in the current frame of the growth image.

Particularly, the step 30 comprises:

Firstly, an image of the crystal growth is acquired by using a CCD camera, wherein the optical axis of the camera head of the CCD camera and the liquid level of the melt in the crucible form a included angle not equal to 90°.

Sub-step 301: selecting an image measurement area.

According to the position of a light ring, an image measurement area is selected in the image frame. The light ring is located at the solid-liquid interface between the solid silicon and the molten silicon in the lower part of the monocrystalline silicon rod.

The image measurement area may also be selected on the image frame according to the grayscale value, wherein the grayscale value should not exceed 200.

Sub-step 302: performing data processing to each of pixels within the image measurement area, and obtaining a velocity amplitude of each of the pixels.

The step comprises acquiring the velocity in the first direction and the velocity in the second direction of a pixel within the image measurement area; and according to the velocity in the first direction, the velocity in the second direction and a first formula, obtaining the velocity amplitude of the pixel within the image measurement area, wherein the first formula comprises:

$$\begin{cases} m_i = \sqrt{u^2 + v^2} * f(\theta_i), 0° \leq \theta_i \leq 360°, \text{ and } \theta_i \neq 90° \\ m_i = \sqrt{u^2 + v^2}, \theta_i = 90° \end{cases}$$

wherein i=1, 2, 3, . . . n, $m_i$ represents the velocity amplitude of the i-th pixel within the image measurement area, $\theta_i$ represents an included angle between the first direction and the second direction, $f(\theta_i)$ represents a function relation formula that is relevant to the $\theta_i$, $u_i$, represents the velocity in the first direction, and $v_i$ represents the velocity in the second direction.

The step of acquiring the velocity in the first direction and the velocity in the second direction of the i-th pixel within the image measurement area comprises: according to a coordinate-point position of the i-th pixel within the image measurement area, an image-collection time interval and a second formula, obtaining the velocity in the first direction and the velocity in the second direction of the i-th pixel within the image measurement area, wherein the second formula is: $(u_i,v_i)=[(x_{i2},y_{i2})-(x_{i1},y_{i1})]/t$; wherein x represents the first direction, y represents the second direction, $(x_{i1},y_{i1})$ represents the coordinate-point position of the i-th pixel within the image measurement area at the (s−1)-th frame (i.e., the previous one frame), $(x_{i2},y_{i2})$ represents the coordinate-point position of the i-th pixel within the image measurement area at the s-th frame (i.e., the current frame), and t represents the image-collection time interval between the s-th frame and the (s−1)-th frame.

Sub-step 303: if the velocity amplitude of a pixel is greater than a preset threshold, determining the pixel to be a moving pixel.

The preset threshold is obtained according to the velocity amplitudes of all of the pixels within the image measurement area, by the following step: according to the velocity amplitudes of the pixels within the image measurement area, the quantity of the pixels within the image measurement area and a third formula, obtaining the preset threshold, wherein the third formula is:

$$Y = \frac{\sum_{1}^{k} M_g}{N};$$

wherein Y represents the preset threshold, $M_g$ represents a velocity amplitude of the g-th pixel within a coverage of the light ring, g=1, 2, 3, . . . k, and N represents a quantity of the pixels within the coverage of the light ring.

The preset threshold may be the average value of the velocity amplitudes of all of the pixels within the image measurement area. The preset threshold may also be set to be another value.

The velocity amplitude of the i-th pixel is compared with a preset threshold, and if the velocity amplitude of the pixel is greater than the preset threshold, it is determined that the pixel is a moving pixel.

Sub-step 304: counting up a quantity of the moving pixels within the image measurement area.

Step 31: within a unit time, counting up to obtain a quantity of moving pixels in all of frames of the growth image and information of a single-crystal-growth duration.

Step 32: according to the information, determining whether the single crystal has a broken line.

according to the quantity of the moving pixels in all of the frames of the growth image and a waveform-variation curve of the single-crystal-growth duration, if a duration of an interval between two neighboring peaks in the waveform-variation curve is greater than a preset duration, it is determined that the single crystal has a broken line.

Figure 17:
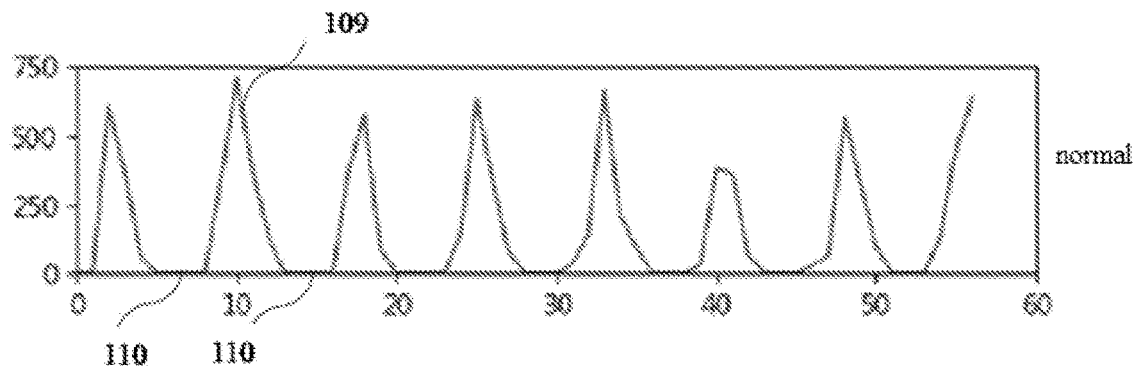
FIG. 17 is curve diagrams of the variation of the quantity of the moving pixels with the single-crystal-growth duration in the method for detecting a broken line according to an embodiment of the present disclosure.
Figure 17:
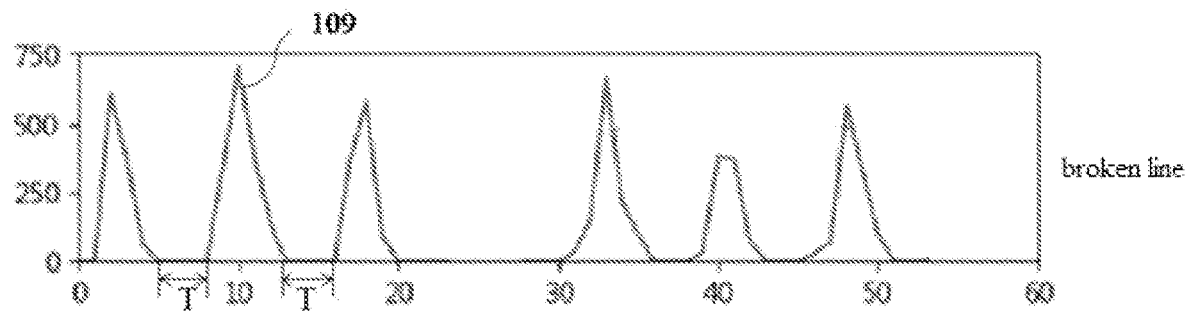

In normal conditions, as shown in FIG. 17, while the crystal is rotating, the peaks of the waveform curve appear periodically. In normal conditions, the duration of the interval between neighboring peaks is set to the predetermined time period. The duration of the interval between neighboring peaks refers to the duration from the end point of the preceding one peak to the starting point of the subsequent one peak. If the duration of the interval between neighboring peaks is greater than the predetermined time period, it is determined that the single crystal has a constant-diameter broken line.

In the present application, the image measurement area is selected according to the position of the light ring, which facilitates to filter out the dark pixel points, to maintain the feature of the crystalline line and the moving pixels of the light ring. By setting the maximum grayscale value within the image measurement area not to exceed 200, the effect of the optical-flow-method processing can be ensured. The present application, by using the preset threshold, can cancel noise, improve the accuracy of the detection and determination, can be adapted for the detection on a constant-diameter broken line in cases of fluctuation of the diameter of the crystalline silicon rod and unclarity of the crystalline-line features of the crystalline silicon rod, which can improve the detection accuracy, to determine accurately whether line breaking has happened.

The Fifth Embodiment

Figure 18:
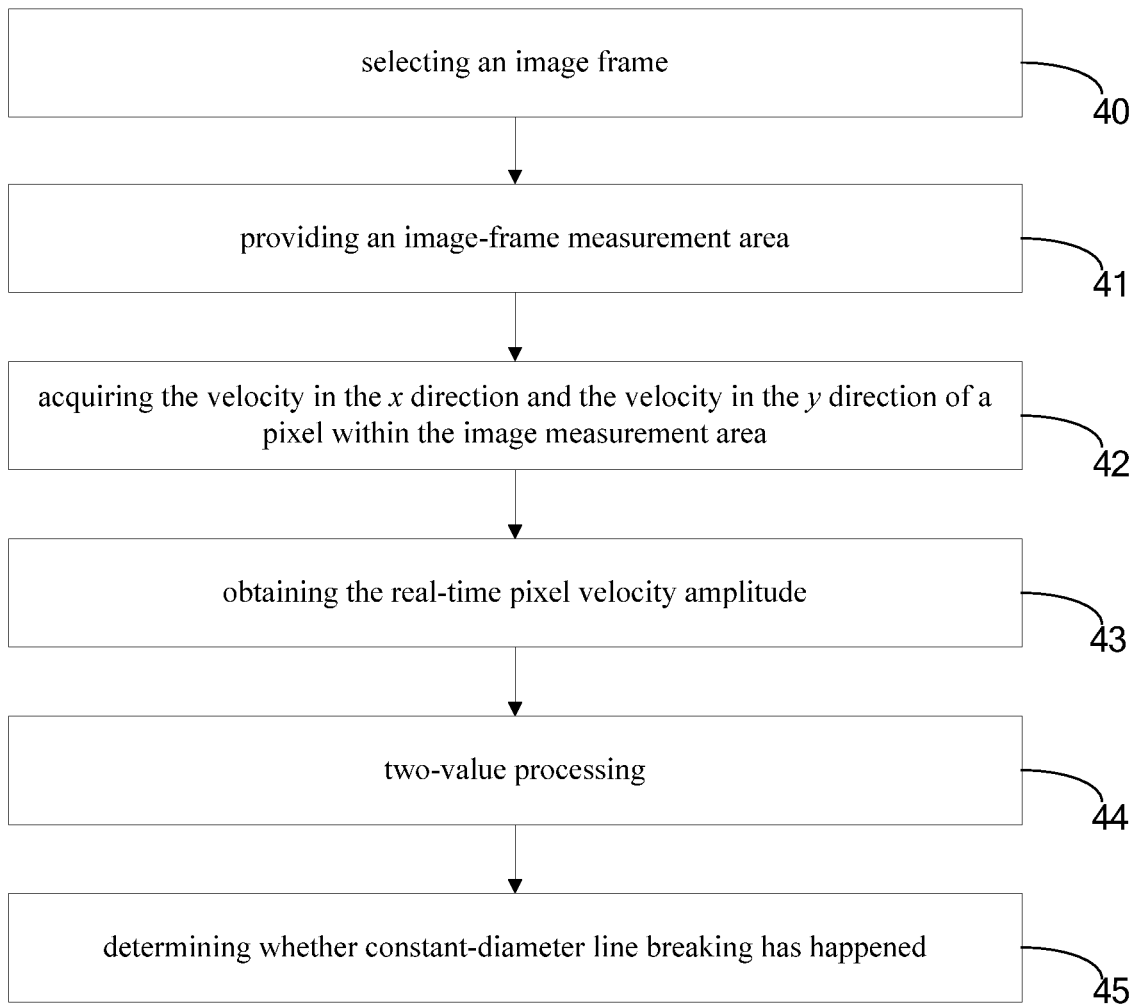
FIG. 18 is a flow chart of the method for detecting a broken line according to the fifth embodiment of the present disclosure.

An embodiment of the present disclosure provides a method for detecting a broken line. As shown in FIG. 18, the method comprises:

Step 40: selecting an image frame.

An image of the crystal growth is acquired by using a CCD camera, wherein the optical axis of the camera head of the CCD camera and the liquid level of the melt in the crucible form a included angle not equal to 90°.

Step 41: providing an image-frame measurement area.

Figure 19:
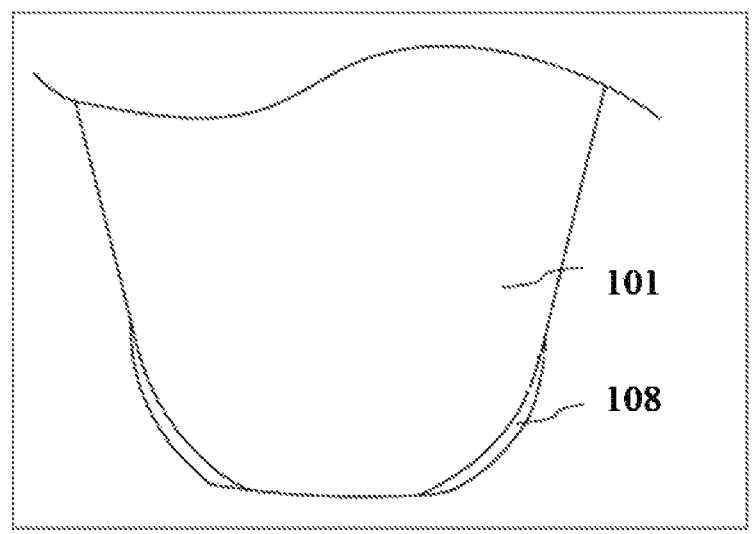
FIG. 19 is a structural diagram of an apparatus for detecting a broken line according to the sixth embodiment of the present disclosure.

Particularly, the step 41 comprises:

according to the position of a light ring 108, selecting an image measurement area in each of the image frames. As shown in FIG. 19, the light ring 108 is located at the solid-liquid interface between the solid silicon and the molten silicon in the lower part of the monocrystalline silicon rod 101.

The image measurement area may also be selected on each of the image frames according to the grayscale value, wherein the grayscale value should not exceed 200.

The image frame of the growth of the czochralski silicon is acquired by using the CCD camera, and is inputted via an electric circuit into an industrial personal computer, and an image processing program of the industrial personal computer processes the image frame of the single crystal growth. Particularly, a feature identifying module in the image processing program identifies the image measurement area. The image measurement area is provided adjacent to the light ring, which facilitates to filter out the dark pixel points. In order to ensure the effect of the optical-flow-method processing of the image, the grayscale value within the image measurement area should not exceed 200.

Step 42: acquiring the velocity in the x direction and the velocity in the y direction of a pixel within the image measurement area.

Particularly, the step 42 comprises:

According to a coordinate-point position of the pixel of any point within the image measurement area, an image-collection time interval and a second formula, obtaining the velocity in the first direction and the velocity in the second direction of the i-th pixel within the image measurement area, wherein the second formula is: $(u_i, v_i) = [(x_{i2}, y_{i2}) - (x_{i1}, y_{i1})]/t$; wherein x represents the first direction, y represents the second direction, $(x_{i1}, y_{i1})$ represents a coordinate-point position of the i-th pixel within the image measurement area at the (s−1)-th frame, $(x_{i2}, y_{i2})$ represents a coordinate-point position of the i-th pixel within the image measurement area at the s-th frame, and t represents the image-collection time interval between the s-th frame and the (s−1)-th frame.

Step 43: obtaining the real-time pixel velocity amplitude.

Particularly, the step 43 comprises:

According to the x velocity, the y velocity and a first formula, obtaining the real-time pixel velocity amplitude within the image measurement area, wherein the first formula comprises:

$$\begin{cases} m_i = \sqrt{u^2 + v^2} * f(\theta_i), \ 0° \le \theta_i \le 360°, \text{ and } \theta_i \ne 90° \\ m_i = \sqrt{u^2 + v^2}, \ \theta_i = 90° \end{cases}$$

wherein i=1, 2, 3, . . . n, $m_i$ represents the velocity amplitude of the i-th pixel within the image measurement area, $\theta_i$ represents an included angle between the first direction and the second direction, $f(\theta_i)$ represents a function relation formula that is relevant to the $\theta_i$, $u_i$ represents the velocity in the first direction, and $v_i$ represents the velocity in the second direction.

In the present embodiment, the optical-flow method is used to process the image frame within the image measurement area. Assuming that the coordinate-point position of the pixel A of any point within the image measurement area at the (s−1)-th frame is (105,105), the coordinate-point position of the pixel A of any point at the s-th frame is (120,140), and t=0.2 s, then the velocities in the first direction and the second direction of the pixel A of any point are: $(u_A, v_A) = (15, 35)$. Because the first direction and the second direction are directions that are perpendicular to each other, the velocity amplitude $m_A$ of the pixel of this point can be solved: $m_A = \sqrt{15^2 + 35^2} = 38.07$.

Step 44: two-value processing.

Two-value processing is performed to the real-time pixel velocity amplitude within the image measurement area, which particularly comprises:

processing the velocity amplitudes of the pixels within the image measurement area to obtain the preset threshold; if the velocity amplitude of a pixel within the image measurement area is greater than the preset threshold, determining that the pixel within the image measurement area is a moving pixel; and counting up to obtain the sum of the moving pixels.

The step of processing the velocity amplitudes of the pixels within the image measurement area to obtain the preset threshold comprises: according to the velocity amplitudes of the pixels within the image measurement area, the quantity of the pixels within the image measurement area and a third formula, obtaining the preset threshold, wherein the third formula is:

$$Y = \frac{\sum_{1}^{k} M_g}{N};$$

wherein Y represents the preset threshold, $M_g$ represents a velocity amplitude of the g-th pixel within a coverage of the light ring, g=1, 2, 3, . . . k, and N represents a quantity of the pixels within the coverage of the light ring.

In the present embodiment, an area of 5 pixels×5 pixels within the light ring is selected, and the total quantity of the pixels is 25. According to $$Y = \frac{\sum_{1}^{k} M_g}{N}$$

and experimentation, the threshold can be solves as Y=30. Because $M_g$ is greater than Y, the g-th pixel is a moving pixel.

Step 45: determining whether constant-diameter line breaking has happened.

Particularly, the step 45 comprises:

Because the silicon rod has the crystalline lines in the axial direction that have clear features, and the crystalline lines are evenly distributed in the circumferential direction of the silicon rod, the present application maintains the moving pixels as the feature of the crystalline line by setting the threshold of the real-time pixel velocity. Whether constant-diameter line breaking has happened is determined according to the variation of the total quantity of the moving pixels with the crystal growth duration. While the crystal is rotating, as shown in FIG. 17, the total quantity of the moving pixels alternately and periodically appears along with the peaks 109 in the waveform curve of the time, and neighboring peaks 109 have an interval 110 therebetween. 109 denotes the peaks, and intervals 110 are between the peaks 109. In the present embodiment, the interval 110 is a platform, which indicates that no moving pixel that has been defined appears within the time range.

As shown in the upper half of FIG. 17, when the single crystal is growing normally, the peaks 109 periodically appear. As shown in the lower half of FIG. 17, if the duration of the interval 110 between two neighboring peaks 109 is greater than a preset duration, it is determined that the single crystal has a constant-diameter broken line. The numerical values in FIG. 17 do not limit the time period and the total quantity of the moving pixels according to the present application, and are merely examples.

In the present embodiment, in normal conditions, the peaks continue for 1.5 s, and the interval between two neighboring peaks continues for 1 s; in other words, the time period is 1 s. When a non-moving pixel has continued for 2.5 s, i.e., the duration of the interval between two neighboring peaks is 2.5 s, which is greater than the time period, and during which completely no peak appears, it can be determined that constant-diameter line breaking has happened.

In the present application, the image measurement area is selected according to the position of the light ring, which facilitates to filter out the dark pixel points, to maintain the feature of the crystalline line and the moving pixels of the light ring. By setting the maximum grayscale value within the image measurement area to be 200, the effect of the optical-flow-method processing can be ensured. The present application, by using the preset threshold, can cancel noise, improve the accuracy of the detection and determination, can be adapted for the detection on a constant-diameter broken line in cases of fluctuation of the diameter of the crystalline silicon rod and unclarity of the crystalline-line features of the crystalline silicon rod, which can improve the detection accuracy, to determine accurately whether line breaking has happened.

The Sixth Embodiment

Figure 20:
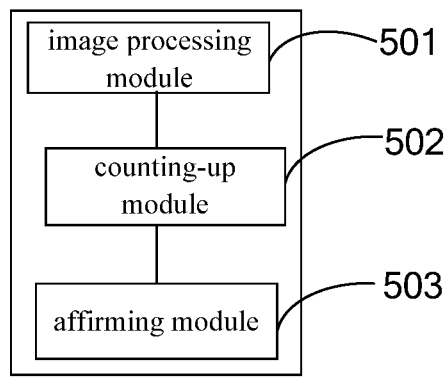
FIG. 20 is a structural diagram of an apparatus for detecting a broken line according to the sixth embodiment of the present disclosure.

Another embodiment of the present disclosure provides an apparatus for detecting a broken line. As shown in FIG. 20, the apparatus comprises:
- an image processing module 501, configured for processing a current frame of an acquired growth image of a single crystal and a previous one frame of the growth image, and obtaining a quantity of moving pixels in the current frame of the growth image;
- a counting-up module 502, configured for, within a unit time, counting up to obtain a quantity of moving pixels in all of frames of the growth image and information of a single-crystal-growth duration; and
- an affirming module 503, configured for, according to the information, determining whether the single crystal has a broken line.

Figure 21:
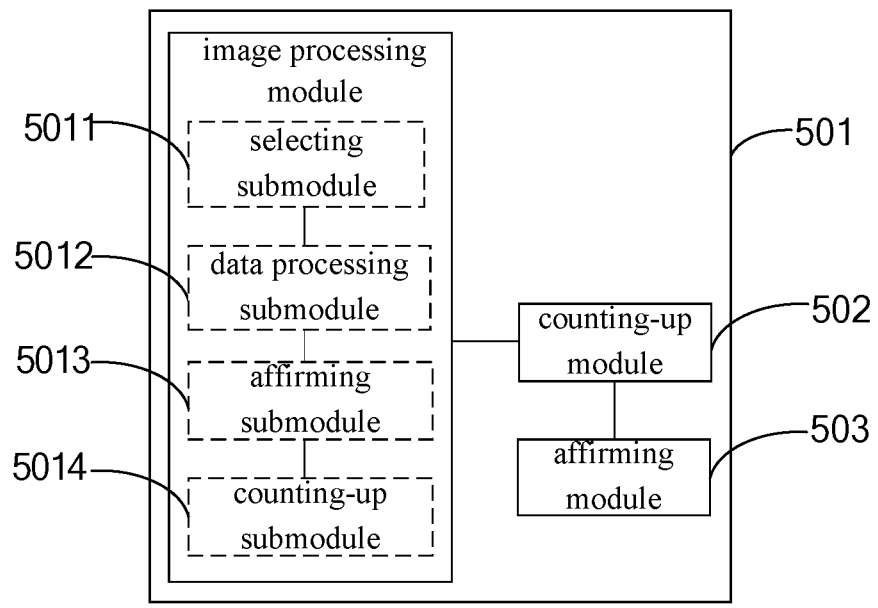
FIG. 21 is a structural diagram of an apparatus for detecting a broken line according to the sixth embodiment of the present disclosure.

In another embodiment, as shown in FIG. 21, the image processing module 501 comprises:
- a selecting submodule 5011, configured for selecting an image measurement area;
- a data processing submodule 5012, configured for performing data processing to each of pixels within the image measurement area, and obtaining a velocity amplitude of each of the pixels;
- an affirming submodule 5013, configured for, if the velocity amplitude of a pixel is greater than a preset threshold, determining the pixel to be a moving pixel; and
- a counting-up submodule 5014, configured for counting up the quantity of the moving pixels of the image measurement area.

In another embodiment, the selecting submodule is configured for, according to a position of a light ring, selecting an image measurement area in each of the image frames.

Figure 22:
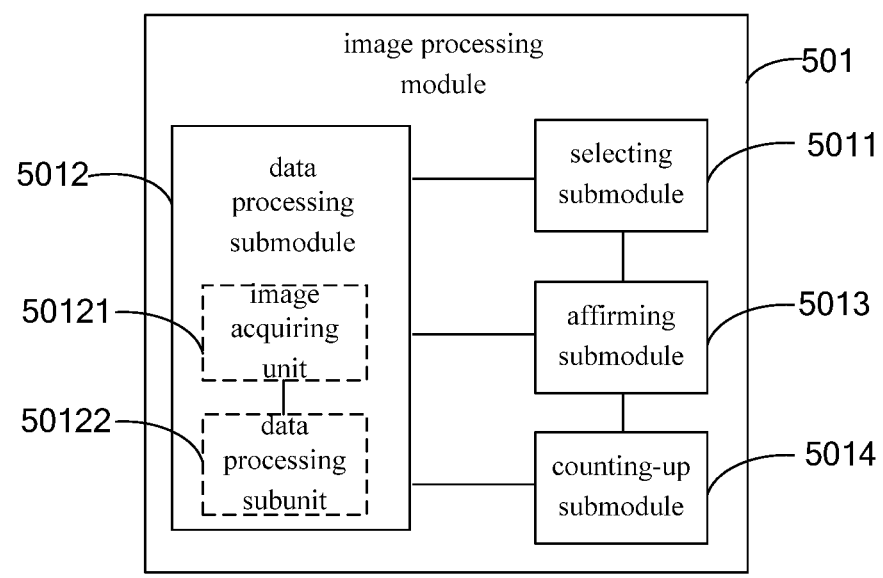
FIG. 22 is a structural diagram of an apparatus for detecting a broken line according to the sixth embodiment of the present disclosure.

In another embodiment, as shown in FIG. 22, the data processing submodule 5012 comprises:
- an image acquiring unit 50121, configured for acquiring a velocity in a first direction and a velocity in a second direction of an i-th pixel within the image measurement area; and
- a data processing subunit 50122, configured for, according to the velocity in the first direction, the velocity in the second direction and a first formula, obtaining a velocity amplitude of the i-th pixel within the image measurement area, wherein the first formula comprises:

$$\begin{cases} m_i = \sqrt{u^2 + v^2} * f(\theta_i), 0° \le \theta_i \le 360°, \text{ and } \theta_i \ne 90° \\ m_i = \sqrt{u^2 + v^2}, \theta_i = 90° \end{cases}$$

wherein i=1, 2, 3, . . . n, $m_i$ represents the velocity amplitude of the i-th pixel within the image measurement area, $\theta_i$ represents an included angle between the first direction and the second direction, $f(\theta_i)$ represents a function relation formula that is relevant to the $\theta_i$, $u_i$ represents the velocity in the first direction, and $v_i$ represents the velocity in the second direction.

In another embodiment, the image acquiring unit 50121 is configured for, according to a coordinate-point position of the i-th pixel within the image measurement area, an image-collection time interval and a second formula, obtaining the velocity in the first direction and the velocity in the second direction of the i-th pixel within the image measurement area, wherein the second formula is: $(u_i, v_i) = [(x_{i2}, y_{i2}) - (x_{i1}, y_{i1})]/t$;

wherein x represents the first direction, y represents the second direction, $(x_{i1}, y_{i1})$ represents a coordinate-point position of the i-th pixel within the image measurement area at the (s−1)-th frame, $(x_{i2}, y_{i2})$ represents a coordinate-point position of the i-th pixel within the image measurement area at the s-th frame, and t represents the image-collection time interval between the s-th frame and the (s−1)-th frame.

In another embodiment, the affirming submodule 5013 is configured for, according to the velocity amplitudes of all of the pixels within the image measurement area, a quantity of the pixels within the image measurement area and a third formula, obtaining the preset threshold, wherein the third formula is:

$$Y = \frac{\sum_{1}^{k} M_g}{N};$$

wherein Y represents the preset threshold, $M_g$ represents a velocity amplitude of the g-th pixel within a coverage of the light ring, g=1, 2, 3, . . . k, and N represents a quantity of the pixels within the coverage of the light ring.

In the present application, the image measurement area is selected according to the position of the light ring, which facilitates to filter out the dark pixel points, to maintain the feature of the crystalline line and the moving pixels of the light ring. By setting the maximum grayscale value within the image measurement area not to exceed 200, the effect of the optical-flow-method processing can be ensured. The present application, by using the preset threshold, can cancel noise, improve the accuracy of the detection and determination, can be adapted for the detection on a constant-diameter broken line in cases of fluctuation of the diameter of the crystalline silicon rod and unclarity of the crystalline-line features of the crystalline silicon rod, which can improve the detection accuracy, to determine accurately whether line breaking has happened.

The Seventh Embodiment

Figure 23:
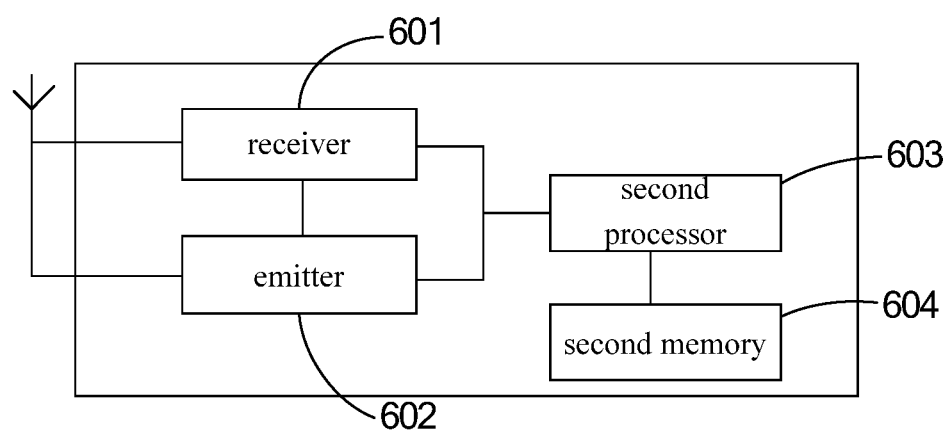
FIG. 23 is a structural diagram of the apparatus for detecting a broken line according to the seventh embodiment of the present disclosure.

An embodiment of the present disclosure further provides a device for detecting a broken line. As shown in FIG. 23, the device comprises a receiver 601, an emitter 602, a second processor 603 and a second memory 604. The receiver 601, the emitter 602 and the second memory 604 are connected to the second processor 603. The second memory 604 stores at least one instruction. The instruction is loaded and executed by the second processor 603 to implement the steps of the method for detecting a broken line according to FIG. 16 or FIG. 18, or the fourth embodiment or the fifth embodiment, to reach the same or similar effects, which, in order to avoid replication, is not discussed here further.

The Eighth Embodiment

An embodiment of the present disclosure further provides a computer-readable storage medium. For example, the non-transitory computer-readable storage medium may be a Read Only Memory (ROM), a Random Access Memory (RAM), a CD-ROM, a magnetic tape, a floppy disk, an optical data storage device and so on. The storage medium stores at least one computer instruction. The instruction is loaded and executed by a second processor to implement the steps of the method for detecting a broken line according to FIG. 16 or FIG. 18, or the fourth embodiment or the fifth embodiment, to reach the same or similar effects, which, in order to avoid replication, is not discussed here further.

The above-described device embodiments are merely illustrative, wherein the units that are described as separate components may or may not be physically separate, and the components that are displayed as units may or may not be physical units; in other words, they may be located at the same one location, and may also be distributed to a plurality of network units. Part or all of the modules may be selected according to the actual demands to realize the purposes of the solutions of the embodiments. A person skilled in the art can understand and implement the technical solutions without paying creative work.

Each component embodiment of the present disclosure may be implemented by hardware, or by software modules that are operated on one or more processors, or by a combination thereof. A person skilled in the art should understand that some or all of the functions of some or all of the components of the calculating and processing device according to the embodiments of the present disclosure may be implemented by using a microprocessor or a digital signal processor (DSP) in practice. The present disclosure may also be implemented as apparatus or device programs (for example, computer programs and computer program products) for implementing part of or the whole of the method described herein. Such programs for implementing the present disclosure may be stored in a computer-readable medium, or may be in the form of one or more signals. Such signals may be downloaded from an Internet website, or provided on a carrier signal, or provided in any other forms.

For example, FIG. 23 shows a calculating and processing device that can implement the method according to the present disclosure. The calculating and processing device traditionally comprises a second processor 603 and a computer program product or computer-readable medium in the form of a second memory 604. The second memory 604 may be electronic memories such as flash memory, EEPROM (Electrically Erasable Programmable Read Only Memory), EPROM, hard disk or ROM. The second memory 604 has the storage space of the program code for implementing any steps of the above method. For example, the storage space for program code may contain program codes for individually implementing each of the steps of the above method. Those program codes may be read from one or more computer program products or be written into the one or more computer program products. Those computer program products include program code carriers such as hard disk, compact disk (CD), memory card or floppy disk. Such computer program products are usually portable or fixed storage units. The storage unit may have storage segments or storage spaces with similar arrangement to the second memory 604 of the calculating and processing device in FIG. 23. The program codes may for example be compressed in a suitable form. Generally, the storage unit contains a computer-readable code, which can be read by a processor like the processor. When those codes are executed by the calculating and processing device, the codes cause the calculating and processing device to implement each of the steps of the method described above.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same one embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware comprising several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A method for detecting a growth state of a crystalline line of a silicon rod, wherein the method comprises:
   in a process of constant-diameter growth of the silicon rod, acquiring a sample image of the silicon rod;
   providing a detection area in the sample image, wherein the detection area overlaps with a crystalline-line growth line of the silicon rod, and in the process of the constant-diameter growth of the silicon rod, the crystalline line of the silicon rod grows along the crystalline-line growth line;
   generating a grayscale-value curve of the detection area; and
   according to the grayscale-value curve, determining the growth state of the crystalline line of the silicon rod on the crystalline-line growth line,
   wherein the detection area comprises: a line segment perpendicular to an axial direction of the silicon rod, or a rectangular area perpendicular to an axial direction of the silicon rod, wherein a plane of the rectangular area is perpendicular to the axial direction of the silicon rod.

2. The method according to claim 1, wherein if the detection area is the line segment perpendicular to the axial direction of the silicon rod, the step of generating the grayscale-value curve of the detection area comprises:

by starting from one end of the line segment, generating a grayscale-value curve corresponding to the line segment.

3. The method according to claim 1, wherein if the detection area is the rectangular area perpendicular to the axial direction of the silicon rod, the step of generating the grayscale-value curve of the detection area comprises:
   by starting from one end of the rectangular area, dividing the rectangular area into a plurality of identical sub-areas;
   calculating an average grayscale value of each of the sub-areas; and
   according to the average grayscale values of all of the sub-areas, generating a grayscale-value curve corresponding to the rectangular area.

4. The method according to claim 1, wherein the step of, according to the grayscale-value curve, determining the growth state of the crystalline line of the silicon rod on the crystalline-line growth line comprises:
   according to the grayscale-value curve, calculating a variance value of the grayscale values in the grayscale-value curve;
   if the variance value of the grayscale values is greater than or equal to a variance-value threshold, determining the growth state to be a continued state; and
   if the variance value of the grayscale values is less than the variance-value threshold, determining the growth state to be a line-breaking state.

5. The method according to claim 1, wherein the step of, according to the grayscale-value curve, determining the growth state of the crystalline line of the silicon rod on the crystalline-line growth line comprises:
   if the grayscale-value curve has a crystalline-line characteristic peak, determining the growth state to be a continued state; and
   if the grayscale-value curve does not have the crystalline-line characteristic peak, determining the growth state to be a line-breaking state.

6. The method according to claim 1, wherein after the step of acquiring the sample image of the silicon rod, the method further comprises:
   according to a predetermined image-enhancement algorithm, performing image-enhancement processing to the sample image.

* * * * *